(12) United States Patent
Chambers et al.

(10) Patent No.: US 10,559,452 B2
(45) Date of Patent: *Feb. 11, 2020

(54) PLASMA DEVICE DRIVEN BY MULTIPLE-PHASE ALTERNATING OR PULSED ELECTRICAL CURRENT

(71) Applicants: AGC Flat Glass North America, Inc., Alpharetta, GA (US); Asahi Glass Co., Ltd., Tokyo (JP); AGC Glass Europe, Louvain-la-Neuve (BE)

(72) Inventors: John Chambers, San Francisco, CA (US); Peter Maschwitz, Sebastopol, CA (US)

(73) Assignees: AGC FLAT GLASS NORTH AMERICA, INC., Alpharetta, GA (US); ASAHI GLASS CO., LTD., Tokyo (JP); AGC GLASS EUROPE, Louvain-la Neuve (BE)

( * ) Notice: Subject to any disclaimer, the term of this patent is extended or adjusted under 35 U.S.C. 154(b) by 0 days.

This patent is subject to a terminal disclaimer.

(21) Appl. No.: 15/645,774

(22) Filed: Jul. 10, 2017

(65) Prior Publication Data

US 2017/0309458 A1 Oct. 26, 2017

Related U.S. Application Data

(63) Continuation of application No. 14/942,737, filed on Nov. 16, 2015, now Pat. No. 9,721,765.

(51) Int. Cl.
*H01J 37/32* (2006.01)
*H05H 1/26* (2006.01)
*H01J 37/30* (2006.01)

(52) U.S. Cl.
CPC .. *H01J 37/32596* (2013.01); *H01J 37/32568* (2013.01)

(58) Field of Classification Search
CPC .. H01J 37/30; H05H 1/26; H05H 1/24; H01L 21/306; C01B 33/12; C23C 16/513
(Continued)

(56) References Cited

U.S. PATENT DOCUMENTS 2,920,235 A 1/1960 Bell et al.
3,253,180 A 5/1966 Huber
(Continued)

FOREIGN PATENT DOCUMENTS

CN 1598049 A 2/2005
CN 1831190 A 9/2006
(Continued)

OTHER PUBLICATIONS

Garcia-Cespedes, et al., "Carbon nanotubes grown by asymmetric bipolar pulsed-DC PECVD", Diamond and Related Materials, vol. 16, pp. 1131-1135, Jan. 25, 2007.
(Continued)

*Primary Examiner* — Wei (Victor) Y Chan
(74) *Attorney, Agent, or Firm* — Rothwell, Figg, Ernst & Manbeck, P.C.

(57) ABSTRACT

A plasma source is provided. The plasma source includes at least three hollow cathodes, including a first hollow cathode, a second hollow cathode, and a third hollow cathode, each hollow cathode having a plasma exit region. The plasma source includes a source of power capable of producing multiple output waves, including a first output wave, a second output wave, and a third output wave, wherein the first output wave and the second output wave are out of phase, the second output wave and the third output wave are out of phase, and the first output wave and the third output wave are out of phase. Each hollow cathode is electrically connected to the source of power such that the first hollow cathode is electrically connected to the first output wave, the
(Continued)

second hollow cathode is electrically connected to the second output wave, and the third hollow cathode is electrically connected to the third output wave. Electrical current flows between the at least three hollow cathodes that are out of electrical phase. The plasma source is capable of generating a plasma between the hollow cathodes.

28 Claims, 15 Drawing Sheets

(58) Field of Classification Search
USPC .............. 434/325; 118/723 E; 427/569, 571; 315/111.41; 156/345.34
See application file for complete search history.

(56) References Cited

U.S. PATENT DOCUMENTS

| | | | |
|---|---|---|---|
| 3,381,157 A | 4/1968 | Ferreira | |
| 3,813,549 A | 5/1974 | Di Stefano et al. | |
| 4,017,808 A | 4/1977 | Fein et al. | |
| 4,196,233 A | 4/1980 | Bitzer et al. | |
| 4,419,203 A | 12/1983 | Harper et al. | |
| 4,422,014 A | 12/1983 | Glaser | |
| 4,702,784 A | 10/1987 | Naoumidis et al. | |
| 4,916,356 A | 4/1990 | Ahern et al. | |
| 5,028,791 A | 7/1991 | Koshiishi et al. | |
| 5,070,811 A | 12/1991 | Feuerstein et al. | |
| 5,113,790 A | 5/1992 | Geisler et al. | |
| 5,185,132 A | 2/1993 | Horiike et al. | |
| 5,286,534 A | 2/1994 | Kohler et al. | |
| 5,302,422 A | 4/1994 | Nowak et al. | |
| 5,369,337 A | 11/1994 | Yanagi | |
| 5,399,254 A | 3/1995 | Geisler et al. | |
| 5,437,778 A | 8/1995 | Hedgcoth | |
| 5,581,155 A | 12/1996 | Morozov et al. | |
| 5,593,539 A | 1/1997 | Kubota et al. | |
| 5,609,690 A * | 3/1997 | Watanabe ............ C23C 16/509 |
| | | | 118/723 E |
| 5,614,248 A | 3/1997 | Schiller et al. | |
| 5,614,273 A | 3/1997 | Goedicke et al. | |
| 5,627,435 A | 5/1997 | Jansen et al. | |
| 5,846,608 A | 12/1998 | Neumann et al. | |
| 5,874,807 A | 2/1999 | Neger et al. | |
| 5,897,753 A | 4/1999 | Schatz et al. | |
| 5,908,602 A | 6/1999 | Bardos et al. | |
| 5,939,829 A | 8/1999 | Schoenbach et al. | |
| 5,985,378 A | 11/1999 | Paquet | |
| 6,082,293 A | 7/2000 | Kawashima | |
| 6,140,773 A | 10/2000 | Anders et al. | |
| 6,146,462 A | 11/2000 | Yializis et al. | |
| 6,174,450 B1 | 1/2001 | Patrick et al. | |
| 6,177,148 B1 | 1/2001 | Walther et al. | |
| 6,293,222 B1 | 9/2001 | Paquet | |
| 6,388,381 B2 | 5/2002 | Anders | |
| 6,444,945 B1 * | 9/2002 | Maschwitz ............ C23C 14/243 |
| | | | 118/723 E |
| 6,489,854 B1 | 12/2002 | Chen | |
| 6,508,911 B1 | 1/2003 | Han et al. | |
| 6,528,947 B1 | 3/2003 | Chen et al. | |
| 6,750,600 B2 | 6/2004 | Kaufman | |
| 6,768,079 B2 | 7/2004 | Kosakai | |
| 6,800,336 B1 | 10/2004 | Förnsel et al. | |
| 6,849,854 B2 | 2/2005 | Sainty | |
| 6,899,054 B1 | 5/2005 | Bárdos et al. | |
| 6,902,814 B2 | 6/2005 | Takahashi et al. | |
| 6,924,223 B2 | 8/2005 | Yamasaki et al. | |
| 7,241,360 B2 | 7/2007 | Shabalin et al. | |
| 7,307,383 B2 | 12/2007 | Takeuchi et al. | |
| 7,322,313 B2 | 1/2008 | Mayumi et al. | |
| 7,327,089 B2 | 2/2008 | Madocks | |
| 7,411,352 B2 | 8/2008 | Madocks | |
| 7,411,353 B1 | 8/2008 | Rutberg et al. | |
| 7,543,546 B2 | 6/2009 | Shibata et al. | |
| 7,649,316 B2 | 1/2010 | Rueger et al. | |
| 7,976,907 B2 | 7/2011 | Hofrichter et al. | |
| 8,143,788 B2 | 3/2012 | Hofer et al. | |
| 8,328,982 B1 | 12/2012 | Babayan et al. | |
| 8,356,575 B2 | 1/2013 | Sasaki et al. | |
| 8,409,459 B2 | 4/2013 | Denpoh et al. | |
| 8,476,587 B2 | 7/2013 | Jones et al. | |
| 8,652,586 B2 | 2/2014 | Maschwitz | |
| 8,697,197 B2 | 4/2014 | Savas et al. | |
| 8,926,920 B2 | 1/2015 | Morfill et al. | |
| 9,443,703 B2 | 9/2016 | Morgner et al. | |
| 9,533,914 B2 | 1/2017 | Mahieu et al. | |
| 9,704,692 B2 * | 7/2017 | Leeser .............. H01J 37/32137 |
| 9,721,765 B2 | 8/2017 | Chambers et al. | |
| 9,735,020 B2 | 8/2017 | Hudson | |
| 10,068,743 B2 | 9/2018 | Goerbing | |
| 2002/0000779 A1 | 1/2002 | Anders | |
| 2002/0194833 A1 | 12/2002 | Gallimore et al. | |
| 2003/0113479 A1 | 6/2003 | Fukuda et al. | |
| 2004/0033385 A1 | 2/2004 | Kaushal et al. | |
| 2005/0016456 A1 | 1/2005 | Taguchi et al. | |
| 2005/0016458 A1 | 1/2005 | Zhang et al. | |
| 2005/0035731 A1 | 2/2005 | Secheresse et al. | |
| 2005/0040037 A1 | 2/2005 | Walton et al. | |
| 2005/0106094 A1 | 5/2005 | Kondo | |
| 2005/0115933 A1 | 6/2005 | Kong et al. | |
| 2005/0208215 A1 | 9/2005 | Eguchi et al. | |
| 2005/0221022 A1 | 10/2005 | Wang et al. | |
| 2006/0030134 A1 | 2/2006 | Kim et al. | |
| 2006/0177599 A1 | 8/2006 | Madocks | |
| 2006/0208649 A1 | 9/2006 | Rueger et al. | |
| 2007/0002515 A1 | 1/2007 | Hino et al. | |
| 2007/0017636 A1 | 1/2007 | Gate et al. | |
| 2007/0123041 A1 | 5/2007 | Anzai et al. | |
| 2007/0144621 A1 | 6/2007 | Farmer et al. | |
| 2007/0163440 A1 | 7/2007 | Kim et al. | |
| 2008/0073557 A1 | 3/2008 | German et al. | |
| 2008/0106202 A1 | 5/2008 | Du et al. | |
| 2009/0004836 A1 * | 1/2009 | Singh .................... H01J 37/321 |
| | | | 438/513 |
| 2009/0032393 A1 | 2/2009 | Madocks | |
| 2009/0071403 A1 | 3/2009 | Choi et al. | |
| 2009/0071406 A1 | 3/2009 | Choi et al. | |
| 2009/0183771 A1 | 7/2009 | Sunnomiya et al. | |
| 2009/0218212 A1 * | 9/2009 | Denpoh .............. H01J 37/3244 |
| | | | 204/164 |
| 2010/0028238 A1 * | 2/2010 | Maschwitz ........... C23C 16/402 |
| | | | 423/335 |
| 2010/0044579 A1 | 2/2010 | Holmes et al. | |
| 2010/0126779 A1 | 5/2010 | Corbett et al. | |
| 2010/0186671 A1 | 7/2010 | Hein et al. | |
| 2010/0225234 A1 | 9/2010 | Tseng et al. | |
| 2011/0005682 A1 | 1/2011 | Savas et al. | |
| 2011/0006040 A1 | 1/2011 | Savas et al. | |
| 2011/0135843 A1 | 6/2011 | Niira et al. | |
| 2011/0192348 A1 | 8/2011 | Tseng et al. | |
| 2011/0212624 A1 | 9/2011 | Hudson | |
| 2011/0226611 A1 | 9/2011 | Madocks | |
| 2011/0297532 A1 | 12/2011 | Chakraborty et al. | |
| 2012/0164353 A1 | 6/2012 | Madocks | |
| 2012/0199469 A1 | 8/2012 | Rasheed et al. | |
| 2012/0225218 A1 | 9/2012 | Savas et al. | |
| 2012/0258555 A1 | 10/2012 | Holland et al. | |
| 2012/0289054 A1 | 11/2012 | Holland et al. | |
| 2012/0313517 A1 | 12/2012 | Rueger et al. | |
| 2013/0112670 A1 | 5/2013 | Yokogawa et al. | |
| 2013/0333618 A1 | 12/2013 | Cox | |
| 2013/0337657 A1 | 12/2013 | Savas et al. | |
| 2014/0099451 A1 | 4/2014 | Mahieu et al. | |
| 2014/0216343 A1 | 8/2014 | Maschwitz | |
| 2014/0220361 A1 | 8/2014 | Maschwitz | |
| 2014/0272388 A1 | 9/2014 | Knight et al. | |
| 2014/0272459 A1 | 9/2014 | Daugherty et al. | |
| 2014/0354119 A1 | 12/2014 | Shishido et al. | |
| 2014/0354149 A1 | 12/2014 | Morgner et al. | |
| 2015/0002021 A1 | 1/2015 | Maschwitz | |
| 2015/0004330 A1 | 1/2015 | Maschwitz | |
| 2015/0152542 A1 * | 6/2015 | Deppisch ............ C23C 14/0042 |
| | | | 204/192.12 |
| 2015/0235814 A1 | 8/2015 | Kawahara et al. | |

(56) References Cited

U.S. PATENT DOCUMENTS

| | | | |
|---|---|---|---|
| 2016/0024657 A1 | 1/2016 | Sakamoto et al. | |
| 2017/0004955 A1* | 1/2017 | Leeser | H01J 37/32137 |
| 2017/0040145 A1* | 2/2017 | Brandon | C23C 16/274 |
| 2017/0178869 A1 | 6/2017 | Chambers et al. | |
| 2018/0025892 A1 | 1/2018 | Biquet et al. | |

FOREIGN PATENT DOCUMENTS

| | | |
|---|---|---|
| CN | 1860587 A | 11/2006 |
| CN | 102099505 A | 6/2011 |
| CN | 102497721 A | 6/2012 |
| CN | 102677022 A | 9/2012 |
| CN | 102771192 A | 11/2012 |
| CN | 102816987 A | 12/2012 |
| CN | 103042317 A | 4/2013 |
| CN | 103493602 A | 1/2014 |
| CN | 103534383 A | 1/2014 |
| CN | 103632911 A | 3/2014 |
| CN | 105427014 A | 3/2016 |
| DE | 199 02 146 A1 | 8/2000 |
| EA | 201391765 A1 | 4/2014 |
| EP | 0727508 A1 | 8/1996 |
| EP | 0881865 A2 | 12/1998 |
| EP | 0886310 A2 | 12/1998 |
| EP | 1035561 A2 | 9/2000 |
| EP | 1913624 B1 | 10/2011 |
| GB | 1 257 015 | 12/1971 |
| JP | S-59228338 A | 12/1984 |
| JP | S61-238962 A | 10/1986 |
| JP | 61251021 A | 11/1986 |
| JP | S63-297560 A | 12/1988 |
| JP | H4-180557 A | 6/1992 |
| JP | H4-358076 A | 12/1992 |
| JP | H5-226258 A | 9/1993 |
| JP | H7-73994 A | 3/1995 |
| JP | H11-335868 A | 12/1999 |
| JP | 3061288 B2 | 4/2000 |
| JP | 2001035692 A | 2/2001 |
| JP | 2002-121670 A | 4/2002 |
| JP | 2002-143795 A | 5/2002 |
| JP | 2003-193239 A | 7/2003 |
| JP | 2004-533703 A | 11/2004 |
| JP | 2005-5065 A | 1/2005 |
| JP | 2005-68444 A | 3/2005 |
| JP | 2005-243892 A | 9/2005 |
| JP | 2005-302681 A | 10/2005 |
| JP | 2006-164683 A | 6/2006 |
| JP | 2007-026781 A | 2/2007 |
| JP | 2007-280641 A | 10/2007 |
| JP | 2008-4814 A | 1/2008 |
| JP | 2008-112580 A | 5/2008 |
| JP | 2009-502554 A | 1/2009 |
| JP | 2009-534797 A | 9/2009 |
| JP | 2010-021140 A | 1/2010 |
| JP | 2010530115 A | 9/2010 |
| JP | 2011-530155 A | 12/2011 |
| JP | 2013-520836 A | 6/2013 |
| JP | 2013-0251367 A | 12/2013 |
| JP | 2014-518947 A | 8/2014 |
| KR | 2008-0024693 A | 3/2008 |
| KR | 10-1179650 B1 | 9/2012 |
| RU | 2239532 C1 | 11/2004 |
| TW | 200304343 A | 9/2003 |
| TW | I233144 B | 5/2005 |
| TW | I235408 B | 7/2005 |
| TW | I244673 B | 12/2005 |
| TW | 200714742 | 4/2007 |
| TW | I294257 B | 3/2008 |
| WO | 96/16531 A1 | 5/1996 |
| WO | 02079815 A2 | 10/2002 |
| WO | 2005-047180 A1 | 5/2005 |
| WO | 2007/015779 A2 | 2/2007 |
| WO | 2012160145 A1 | 11/2012 |
| WO | 2015/022621 A1 | 2/2015 |
| WO | 2016/089424 A1 | 6/2016 |
| WO | 2016/089427 A1 | 6/2016 |
| WO | 2016/104076 A1 | 6/2016 |

OTHER PUBLICATIONS

PCT International Search Report and Written Opinion, issued in PCT/US 09/52679 dated Sep. 28, 2009, 12 pages.

L. Bardos, et al., "Linear Arc Discharge (LAD)—Radio Frequency Hollow Cathode Plasma Source for Low Pressure Processing," 1996 Society of Vacuum Coaters, 39th Annual Technical Conference Proceedings (1996), ISSN 0737-5921, pp. 128-132.

L. Bardos, et al., "PECVD by Hollow Cathodes," 1998 Society of Vacuum Coaters, 41st Annual Technical Conference Proceedings (1998), ISSN 0737-5921, pp. 315-320.

A. Belkind, et al., "Linear Plasma Source for Reactive Etching and Surface Modification," 1995 Society of Vacuum Coaters, 38th Annual Technical Conference Proceedings (1995), ISSN 0737-5921, pp. 432-436.

A. E. Delahoy, et al., "Transparent and semitransparent conducting film deposition by reactive-environment, hollow cathode sputtering," American Vacuum Society, J. Vac. Sci, Technol. A 23(4), Jul./Aug. 2005, pp. 1215-1220.

J. Madocks, et al., "Large Area Plasma Enhanced Chemical Vapor Deposition of SiO2 on Glass and Plastic," 2007 Society of Vacuum Coaters, 50th Annual Technical Conference Proceedings (2007), ISSN 0737-5921, pp. 233-238.

A.A. Pradhan, et al., "High Deposition Rate Reactive Sputtering with Hollow Cathode," 2002 Society of Vacuum Coaters, 45th Annual Technical Conference Proceedings (2002), ISSN 0737-5921, pp. 96-100.

C. M. Horwitz, "Silicon deposition in diode and hollow-cathode systems," 1989 American Vacuum Society, J. Vac. Sci. Technol. B 7 (3), May/Jun. 1989, pp. 443-449.

S.K. Deb, "The Role of Vacuum Coatings in Cost-Effective Photovoltaic Technologies," Society of Vacuum Coaters, 51st Annual Technical Conference Proceedings, Apr. 19-24, 2008, ISSN 0737-5921, pp. 101-106.

Japanese Office Action issued in JP 2011-522159 dated Jun. 25, 2013, including English language translation, 8 pages.

Argentine Office Action issued in AR 072911 A1, dated Jun. 11, 2013, 4 pages.

Eurasian Office Action issued in EA 201100298 dated Mar. 16, 2013, 2 pages.

Philippine Office Action issued in PH 1/2011/500255 dated Jul. 16, 2013, 1 page.

Japanese Office Action issued in JP 2011-522159 dated Mar. 18, 2014, including English language translation, 8 pages.

M. Mildner et al., "13.56 MHz hollow cathode jet matrix plasma source for large area surface coating," Surface and Coatings Technology, vol. 112, pp. 366-372, XP000983344 (1999).

Extended European Search Report, issued in EP 09805431.5 dated Aug. 4, 2014, 16 pages.

Taiwanese Office Action, issued in TW 098126292 dated Mar. 23, 2015, including English language translation, 41 pages.

Korean Office Action, issued in KR 10-2011-7005282 dated Aug. 22, 2015, including English language translation, 21 pages.

Chinese Office Action, issued in CN 2009801395606 dated Dec. 29, 2014, including English language translation, 9 pages.

D. Child et al., "Enhanced Hollow Cathode Plasma Source for Low Pressure Electron-Beam Deposition Processes", 2014 Society of Vacuum Coaters 505/856-7188, ISSN 0737-5921, May, 2014, 6 pages.

B. Buchholtz, "Physics of Ion Beam Sources" 7 pages.

International Search Report and Written Opinion, issued in PCT/US2014/068919 dated Feb. 24, 2015, 13 pages.

International Search Report and Written Opinion, issued in PCT/US14/68858 dated Mar. 5, 2015, 12 pages.

M. Proschek et al., "The effect of phase difference between powered electrodes on RF plasmas", Plasma Sources Sci. Technol. 14, 2005, 407-411.

(56) References Cited

OTHER PUBLICATIONS

United Arab Emirates Office Action issued in UAE 119/2011 dated Apr. 10, 2016, 17 pages.
Chinese Office Action, issued in CN 201410641340.2 dated Jun. 2, 2016, including English language translation, 11 pages.
Japanese Office Action, issued in JP 2015-134085 dated Aug. 23, 2016, including English language translation, 9 pages.
Japanese Office Action, issued in JP 2015-134098 dated Aug. 30, 2016, including English language translation, 10 pages.
Japanese Office Action, issued in JP 2015-134106 dated Aug. 30, 2016, including English language translation, 10 pages.
Japanese Office Action, issued in JP 2015-134112 dated Aug. 2, 2016, including English language translation, 5 pages.
Japanese Office Action, issued in JP 2015-134116 dated Aug. 30, 2016, including English language translation, 10 pages.
European Search Report, issued in EP 09805431.5 dated Apr. 8, 2016, 6 pages.
Taiwanese Office Action, issued in TW 10521126650, dated Sep. 9, 2016, 10 pages.
Taiwanese Office Action, issued in TW 10521126670, dated Sep. 9, 2016, 9 pages.
Chinese Office Action, issued in CN 201510505370.5 dated Nov. 28, 2016, including English language translation, 22 pages.
International Search Report and Written Opinion, issued in PCT/US2016/061134 dated Jan. 9, 2017, 24 pages.
International Search Report and Written Opinion, issued in PCT/US2016/060979 dated Jan. 9, 2017, 16 pages.
Taiwanese Office Action, issued in TW 105103045, dated Dec. 30, 2016, including English language translation, 7 pages.
Japanese Office Action, issued in JP 2015-134116 dated Mar. 28, 2017, including English language translation, 9 pages.
Non-final Office Action, issued in U.S. Appl. No. 14/486,779, dated Mar. 24, 2017, 80 pages.
Non-final Office Action, issued in U.S. Appl. No. 14/148,606, dated Apr. 6, 2017, 36 pages.
Non-final Office Action, issued in U.S. Appl. No. 14/975,286, dated Apr. 7, 2017, 61 pages.
Non-final Office Action, issued in U.S. Appl. No. 14/975,415, dated Apr. 14, 2017, 69 pages.
Final Office Action, issued in U.S. Appl. No. 14/486,726, dated May 17, 2017, 38 pages.
Chinese Office Action issued in CN 201510505383.2 dated May 17, 2017, including English language translation, 24 pages.
Chinese Office Action issued in CN 201510505381.3 dated Jun. 5, 2017, including English language translation, 19 pages.
Chinese Office Action issued in CN 201510505370.5 dated Jul. 21, 2017, including English language translation, 23 pages.
Japanese Office Action issued in JP 2015-134112 dated Jul. 4, 2017, including English language translation, 5 pages.
First Examination Report issued in Indian Patent Application No. 357/MUMNP/2011 dated Aug. 21, 2017, including English language translation, 10 pages.
Office Action issued for U.S. Appl. No. 14/942,737, dated Sep. 22, 2016, 53 pages.
Office Action issued in U.S. Appl. No. 14/486,779 dated Sep. 28, 2017, 8 pages.
Office Action issued in U.S. Appl. No. 14/486,726 dated Oct. 6, 2017, 15 pages.
Office Action issued in U.S. Appl. No. 14/148,606 dated Oct. 10, 2017, 18 pages.
Office Action issued in U.S. Appl. No. 14/975,415 dated Oct. 19, 2017, 17 pages.
Office Action issued in U.S. Appl. No. 14/975,286 dated Oct. 23, 2017, 17 pages.
Notification of Reasons for Rejection issued in Japanese Application No. 2015-134116 dated Oct. 24, 2017, along with English translation, 9 pages.
Notification issued in Eurasian Patent Application No. 201400544 dated Dec. 7, 2017, 4 pages.
Office Action issued for Chinese Patent Application No. 201510505383.2 dated Feb. 1, 2018, along with English translation (4 pages).
Office Action issued for Chinese Patent Application No. 201510505383.3 dated Feb. 1, 2018, along with English translation (15 pages).
Office Action issued for Chinese Patent Application No. 201510505370.5 dated Feb. 5, 2018, along with English translation (23 pages).
Office Action issued in U.S. Appl. No. 14/148,606 dated Apr. 5, 2018 (18 pages).
Communication issued in European Patent Application No. 09805431.5 dated Apr. 12, 2018 (10 pages).
Office Action issued for U.S. Appl. No. 14/975,415 dated May 4, 2018, 18 pages.
Office Action issued for Japanese Patent Application No. 2017-093637 dated May 29, 2018, along with English translation, 10 pages.
Office Action issued for U.S. Appl. No. 14/486,726 dated Jun. 22, 2018, 48 pages.
Office Action issued for U.S. Appl. No. 14/975,286 dated Jun. 28, 2018, 44 pages.
Examination Report, in corresponding Philippine Application No. 1/2015/500540, dated May 8, 2018, 2 pages.
Extended European Search Report dated Jul. 3, 2018, issued in European Patent Application No. 14907243.1, 10 pages.
Extended European Search Report dated Jul. 16, 2018, issued in European Patent Application No. 14907576.4, 9 pages.
Office Action issued for Japanese Patent Application No. 2017-146662 dated Aug. 7, 2018, along with English translation, 6 pages.
Office Action issued for Japanese Patent Application No. 2015-134106 dated Aug. 28, 2018, along with English translation, 13 pages.
Office Action issued for Japanese Patent Application No. 2017-529720 dated Sep. 25, 2018, along with English translation, 12 pages.
Office Action issued for U.S. Appl. No. 15/532,855 dated Oct. 12, 2018, 19 pages.
Office Action issued for Eurasian Patent Application No. 201791237 dated Dec. 26, 2018, along with English translation, 4 pages.
Office Action issued for Chinese Patent Application No. 201510505370.5 dated Dec. 14, 2018, along with English translation, 6 pages.
Office Action issued for U.S. Appl. No. 15/532,845 dated Dec. 31, 2018, 33 pages.
Office Action issued for Japanese Patent Application No. 2017-529717 dated Nov. 27, 2018, along with English translation, 4 pages.
Office Action issued for U.S. Appl. No. 14/975,415 dated Dec. 13, 2018, 16 pages.
Office Action issued for Eurasian Patent Application No. 201791234 dated Dec. 11, 2018, along with English translation, 2 pages.
Office Action issued for Chinese Patent Application No. 201480084542.X dated Dec. 29, 2018, along with English translation, 24 pages.
Office Action issued for Chinese Patent Application No. 20148004528.X dated Feb. 28, 2019, along with English translation, 18 pages.
Office Action issued for Japanese Patent Application No. 2017-146662 dated Mar. 26, 2019, along with English translation, 11 pages.
Examination Report, in corresponding Philippine Patent Application No. 1/2015/500539, dated Apr. 10, 2019, 5 pages.
Office Action issued for U.S. Appl. No. 15/532,855 dated May 2, 2019, 57 pages.
Office Action issued for Japanese Patent Application No. 2018-532069 dated May 28, 2019, along with English translation, 15 pages.
Office Action issued in Brazillian Patent Application No. PI0916880-0 dated May 28, 2019, 7 pages.
Extended European Search Report issued in European Patent Application No. 16866871.3, dated Jul. 3, 2019, 10 pages.
Substantive Examination Report issued in Philippine Patent Application No. 1/2015/500541, dated Jul. 5, 2019, 7 pages.
Office Action issued for U.S. Appl. No. 15/532,845 dated Jul. 9, 2019, 67 pages.
Extended European Search Report issued in European Patent Application No. 16876262.3, dated Jul. 19, 2019, 11 pages.

(56) References Cited

OTHER PUBLICATIONS

Office Action issued for Japanese Patent Application No. 2017-529720 dated Jul. 23, 2019, along with English translation, 17 pages.
Office Action issued in Chinese Patent Application No. 201680078860.4, dated Aug. 1, 2019, with English translation, 31 pages.
Office Action issued in Indonesian Patent Application No. P-00201702394 dated Aug. 19, 2019 (no English translation), 3 pages.
Office Action issued in Eurasian Patent Application No. 201791234, dated Aug. 27, 2019, with English translation, 3 pages.
Office Action issued in connection with Eurasian Patent Application No. 201791237, dated Aug. 29, 2019, with English translation, 3 pages.
Office Action issued in Chinese Patent Application No. 201480084542.X, dated Sep. 11, 2019, with English translation, 22 pages.
Office Action issued in Chinese Patent Application No. 201680081988.6, dated Sep. 25, 2019, with English translation, 35 pages.
Office Action issued in Indonesian Patent Application No. P-00201704208, dated Oct. 8, 2019 (no English translation), 3 pages.
Office Action issued in Eurasian Patent Application No. 201891175, dated Oct. 16, 2019, (no English translation), 2 pages.
Office Action issued in Chinese Patent Application No. 201480084528.X, dated Nov. 7, 2019, with English translation, 16 pages.
Office Action issued for U.S. Appl. No. 15/532,845 dated Dec. 12, 2019, 58 pages.

\* cited by examiner

PLASMA DEVICE DRIVEN BY MULTIPLE-PHASE ALTERNATING OR PULSED ELECTRICAL CURRENT

CROSS REFERENCE TO RELATED APPLICATION(S)

This application is a continuation of U.S. application Ser. No. 14/942,737, filed Nov. 16, 2015. The content of this application is incorporated herein by reference.

BACKGROUND OF THE INVENTION

Hollow cathode plasma sources are commonly used in the art for coating and surface treatment applications. These plasma sources comprise one or more hollow cathodes electrically connected to a source of power. Several different types of hollow cathodes may be used in these plasma sources, including point sources or linear hollow cathodes.

Power sources used in hollow cathode plasma sources are typically configured to supply one of direct current, alternating current, or pulsed current (i.e., current having a square or rectangular waveform where the duty cycle is less than 100%) to the hollow cathodes. Bipolar power sources (i.e. two phase power supplies) are currently used to provide alternating or pulsed current to a hollow cathode plasma source.

The use of direct current during operation of a linear hollow cathode plasma source causes plasma to be generated primarily in a single area, rather than throughout the entire length of the linear hollow cathode. Although some types of plasma sources using direct current can effectively utilize magnets to generate a uniform plasma, this cannot be done with linear hollow cathodes. However, a high degree of uniformity (not achievable by the use of direct current in a linear hollow cathode plasma source) is necessary for many applications, such as coating glass using plasma-enhanced chemical vapor deposition.

The inventors previously discovered that, in a hollow cathode plasma source, using two-phase (bipolar) alternating or pulsed power can achieve a uniform linear plasma. However, the use of two-phase power in hollow cathode plasma sources has some disadvantages. For example, due to the alternation of the power, a plasma is not actively generated (i.e., there is no active electron emission) by the plasma source for some portion of the operational time. For typical applications, this time where plasma is not being actively generated is approximately 25% of a period of the power supply. Another disadvantage is that there is significant wear on the plasma source due to the use of the two-phase power source, which decreases the operational life of the plasma source.

Thus, there is a need in the art for plasma sources that overcome these and other disadvantages of known plasma sources.

BRIEF SUMMARY OF THE INVENTION

The following commonly-assigned applications describe various hollow cathode plasma sources, such as may be used in embodiments of the present invention: U.S. application Ser. No. 12/535,447, now U.S. Pat. No. 8,652,586; U.S. application Ser. No. 14/148,612; U.S. application Ser. No. 14/148,606; U.S. application Ser. No. 14/486,726; U.S. application Ser. No. 14/486,779; PCT/US14/068919; PCT/US14/68858. Each of these applications is incorporated herein by reference in its entirety.

Advantages of embodiments of the present invention include, but are not limited to, improved operational life of a plasma source, improved deposition rate, and improved time of active plasma generation. Additionally, embodiments of the present invention result in increased disassociation energy in the precursor gas or gasses used, which leads to denser coatings when using plasma-enhanced chemical vapor deposition.

According to a first aspect of the invention, a plasma source is provided. The plasma source includes at least three hollow cathodes, including a first hollow cathode, a second hollow cathode, and a third hollow cathode. Each hollow cathode has a plasma exit region. The plasma source also includes a source of power capable of producing multiple output waves, including a first output wave, a second output wave, and a third output wave. The first output wave and the second output wave are out of phase, the second output wave and the third output wave are out of phase, and the first output wave and the third output wave are out of phase. Each hollow cathode is electrically connected to the source of power such that the first hollow cathode is electrically connected to the first output wave, the second hollow cathode is electrically connected to the second output wave, and the third hollow cathode is electrically connected to the third output wave. Electric current flows between the at least three hollow cathodes that are out of electrical phase. The plasma source is capable of generating a plasma between the hollow cathodes.

According to a second aspect of the invention, a method of producing a plasma is provided. The method includes providing at least three hollow cathodes, including a first hollow cathode, a second hollow cathode, and a third hollow cathode. Each hollow cathode has a plasma exit region. The method also includes providing a source of power capable of producing multiple output waves, including a first output wave, a second output wave, and a third output wave. The first output wave and the second output wave are out of phase, the second output wave and the third output wave are out of phase, and the first output wave and the third output wave are out of phase. Each hollow cathode is electrically connected to the source of power such that the first hollow cathode is electrically connected to the first output wave, the second hollow cathode is electrically connected to the second output wave, and the third hollow cathode is electrically connected to the third output wave. Electric current flows between the at least three hollow cathodes that are out of electrical phase. A plasma is generated between the hollow cathodes. In some embodiments, the method further includes providing a substrate and forming a coating on the substrate using plasma-enhanced chemical vapor deposition.

In some embodiments (according to any of the aspects of the present invention), the plasma generated by the plasma source includes active electron emission for at least substantially 80% of a period of the multiple output waves; in other embodiments, the plasma source includes active electron emission for at least substantially 90%, or at least substantially 100%, of a period of the multiple output waves.

In some embodiments, the at least three hollow cathodes are out of electrical phase by a phase angle different from 180°. In some embodiments, the at least three hollow cathodes are out of electrical phase by a phase angle of 120°. In some embodiments, each adjacent pair of the at least three hollow cathodes is out of electrical phase by the same phase angle as each other adjacent pair of the at least three hollow cathodes. In some embodiments, the at least three hollow cathodes are linear hollow cathodes. In some embodiments, the at least three hollow cathodes each include elongated cavities. In some embodiments, the plasma exit region for each of the at least three hollow cathodes includes a plurality of plasma exit orifices. In some embodiments, the plasma exit region for each of the at least three hollow cathodes includes a plasma exit slot.

In some embodiments, the at least three hollow cathodes are each electrically insulated such that only interior surfaces of the hollow cathode and the plasma exit region are electron-emitting and -accepting. In some embodiments, virtually all the generated plasma flows through the plasma exit region of each of the at least three hollow cathodes. In some embodiments, the current flow is comprised of electrons derived from secondary electron emission. In some embodiments, the current flow is comprised of electrons derived from thermionic-emitted electrons.

In some embodiments, the at least three hollow cathodes are linearly arranged. In some embodiments, the at least three hollow cathodes are configured to direct each of the plasma exit regions to a common line. In some embodiments, a distance between each pair of the at least three hollow cathodes is the same distance. In some embodiments, the electrical current flowing between the at least three hollow cathodes that are out of electrical phase produces an electric potential difference (e.g., a peak-to-peak electric potential difference) between the at least three hollow cathodes. In some embodiments, the electric potential difference is at least 50V between any two of the at least three hollow cathodes. In some embodiments, the electric potential difference is at least 200V between any two of the at least three hollow cathodes. In some embodiments, the multiple output waves comprise square waves whereby the electric potential difference (e.g., peak-to-peak electric potential difference) is reduced relative to sinusoidal waves for the same overall power input. In some embodiments, the source of power is in the form of AC electrical energy. In some embodiments, the source of power is in the form of pulsed electrical energy.

In some embodiments, the generated plasma is substantially uniform over its length in the substantial absence of magnetic-field driven closed circuit electron drift. In some embodiments, the plasma is made substantially uniform over its length from about 0.1 m to about 1 m. In some embodiments, the plasma is made substantially uniform over its length from about 1 m to about 4 m. In some embodiments, the frequencies of each of the multiple output waves are equal and are in the range from about 1 kHz to about 500 MHz. In some embodiments, the frequencies of each of the multiple output waves are equal and are in the range from about 1 kHz to about 1 MHz. In some embodiments, the frequencies of each of the multiple output waves are equal and are in the range from about 10 kHz to about 200 kHz. In some embodiments, the frequencies of each of the multiple output waves are equal and are in the range from about 20 kHz to about 100 kHz. In some embodiments, the electrons from an emitting surface are confined by the hollow cathode effect. In some embodiments, the electrons from an emitting surface of each of the at least three hollow cathodes are not confined by magnetic fields. In some embodiments, at least one of the multiple output waves produced by the source of power is configured to power a plurality of the at least three hollow cathodes.

BRIEF DESCRIPTION OF THE SEVERAL VIEWS OF THE DRAWINGS

The accompanying drawings, which are incorporated herein and form part of the specification, illustrate various embodiments of the present disclosure and, together with the description, further serve to explain the principles of the disclosure and to enable a person skilled in the pertinent art to make and use the embodiments disclosed herein. In the drawings, like reference numbers indicate identical or functionally similar elements.

DETAILED DESCRIPTION OF THE INVENTION

Figure 1:
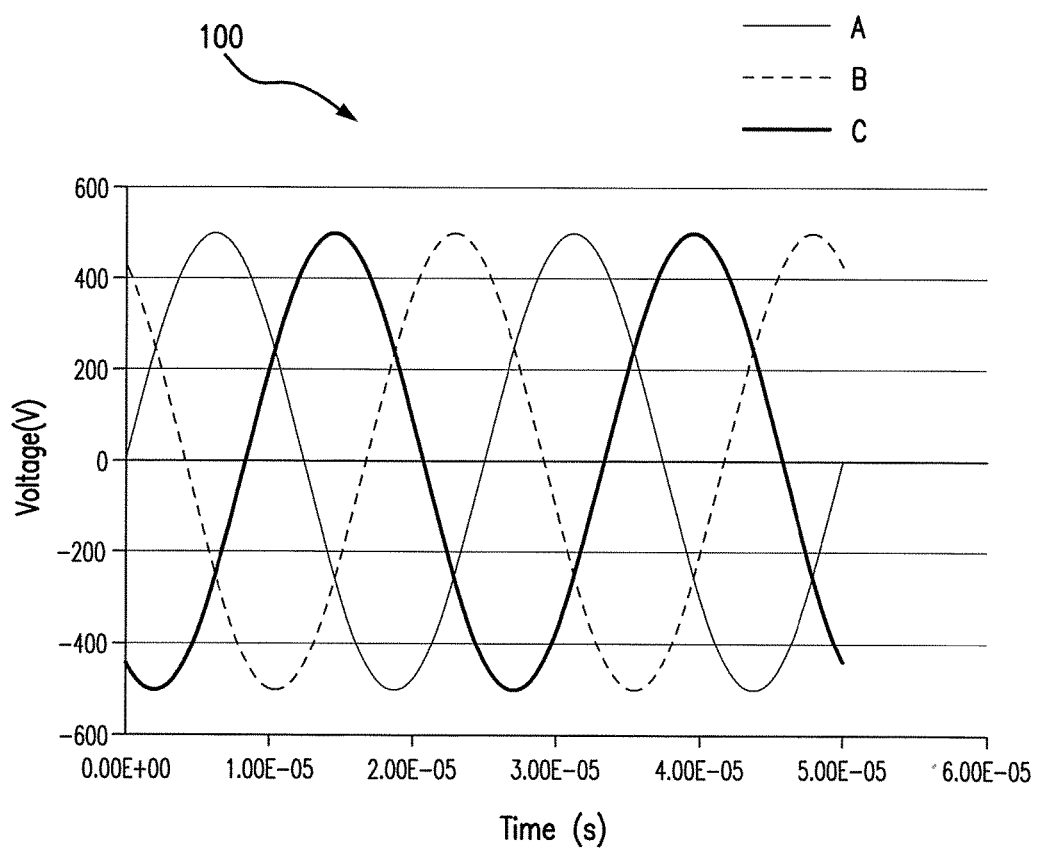
FIG. 1 illustrates a three-phase sinusoidal waveform according to exemplary embodiments of the present invention.

Consider a sine wave $A \sin 2\pi ft + \varphi$, where A is the amplitude, f is the frequency, and $\varphi$ is the phase angle. The phase angle $\varphi$ specifies where the oscillation is at time t=0. With respect to two sine waves $A_1 \sin 2\pi ft + \varphi_1$ and $A_2 \sin 2\pi ft +_2$, the phase difference between the two waves is defined as the difference of phase angles $\varphi_2 - \varphi_1$. Note that this definition makes the phase difference depend on which wave is considered the first wave and which wave is considered the second wave. That is, if the order is changed, the sign of the phase difference will change. The wave that has a larger phase angle is said to be the leading wave, and the wave with a smaller phase angle is said to be the lagging wave. If the leading wave is considered to be the first wave, and the phase difference is $\varphi$, then considering the lagging wave as the first wave will lead to a phase difference of $-\varphi$. Generally this specification will not treat the sign of the phase difference with much significance, and will not consider the order of the waves as significant. Although $\varphi$ is expressed in radians in the formula above, this application will generally discuss (as a matter of convenience) phase angle or phase difference in degrees. Since a sine wave has a cycle or period of exactly 360° (or $2\pi$ radians), the phase angle $\varphi$ can be expressed as a number between $-180°$ (or $-\pi$ radians) and $+180°$ (or $+\pi$ radians). The phase difference is independent of amplitude A and is properly defined only between two waves that have the same frequency f.

Where the two waves share the same phase angle $\varphi$, there is no phase difference and the waves are said to be in phase (with respect to each other). Where the two waves do not share the same phase angle $\varphi$, the waves are said to be out of phase (with respect to each other). Where the phase difference is 180°, the two waves are said to be antiphase (with respect to each other). Phase difference is a property between two waves. Two waves that have a phase difference with respect to each other may also be referred to as being offset, or phase-offset, from each other. One of ordinary skill in the art will also recognize that phase difference can be defined for square waves, pulse waves, and other waveforms.

When two hollow cathodes are being powered by two waves that are out of phase, this application will refer to those hollow cathodes as being phase offset (with respect to each other) by a given phase angle, defined as the phase difference of the two waves powering the hollow cathodes. Thus, either the waves or the hollow cathodes can be said (interchangeably) to be phase offset from each other. Alternatively, if the two waves are in phase, the two hollow cathodes will (interchangeably) be referred to as being in phase.

"Thermionic" is taken to mean electron emission from a surface where emission is greatly accelerated by an elevated surface temperature. Thermionic temperatures are generally about 600° C. or greater.

"Secondary electron" or "secondary electron current" is taken to mean electron emission from a solid surface as a result of bombardment of that surface by a particle and the current that is created as a result, respectively. Electron emitting surfaces in accordance with embodiments of the present invention can generate a plasma and the surfaces are, in turn, further impinged upon by electrons or ions. The impingement of the electron emitting surfaces by electrons, or ions, results in secondary electrons emitted from the electron emitting surfaces. Secondary electron emission is important because secondary electron flow aids in creating a densified plasma.

FIG. 1 illustrates a three-phase sinusoidal waveform according to embodiments of the present invention. The three different sinusoidal waves (A, B, C) in waveform plot 100 are each out of phase by ±120° with respect to each other. Specifically, pairs (A, B) and (B, C) are each out of phase by ±120° and pair (A, C) is out of phase by −120°.

Figure 2:
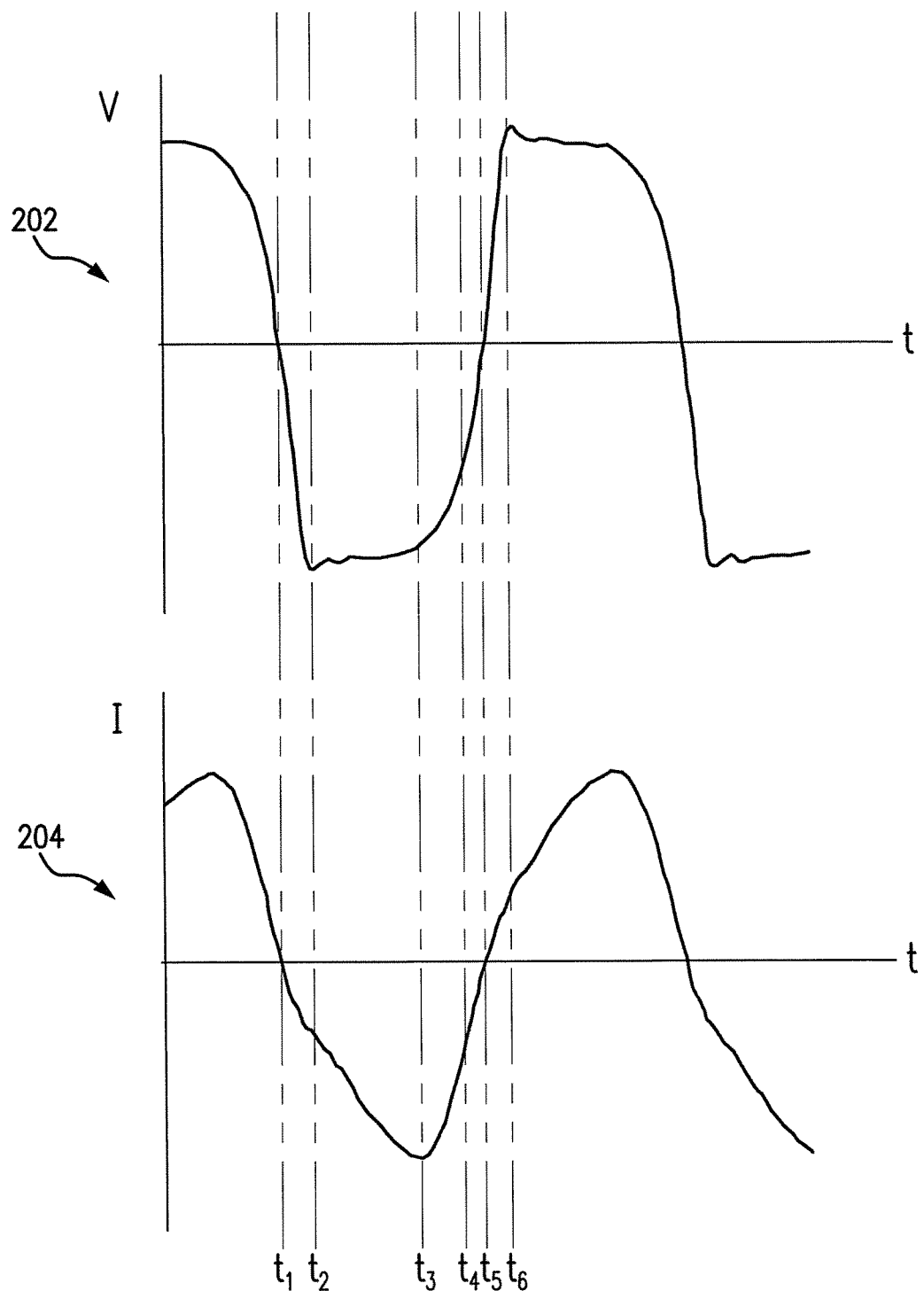
FIG. 2 illustrates voltage and current plots between a pair of hollow cathodes in a bipolar hollow cathode plasma source.

FIG. 2 illustrates voltage and current plots between a pair of hollow cathodes in a bipolar hollow cathode plasma source. Time points $t_1$, $t_2$, $t_3$, $t_4$, $t_5$, and $t_6$ are indicated on voltage plot 202 and current plot 204 and denote various points of interest.

Figure 3:
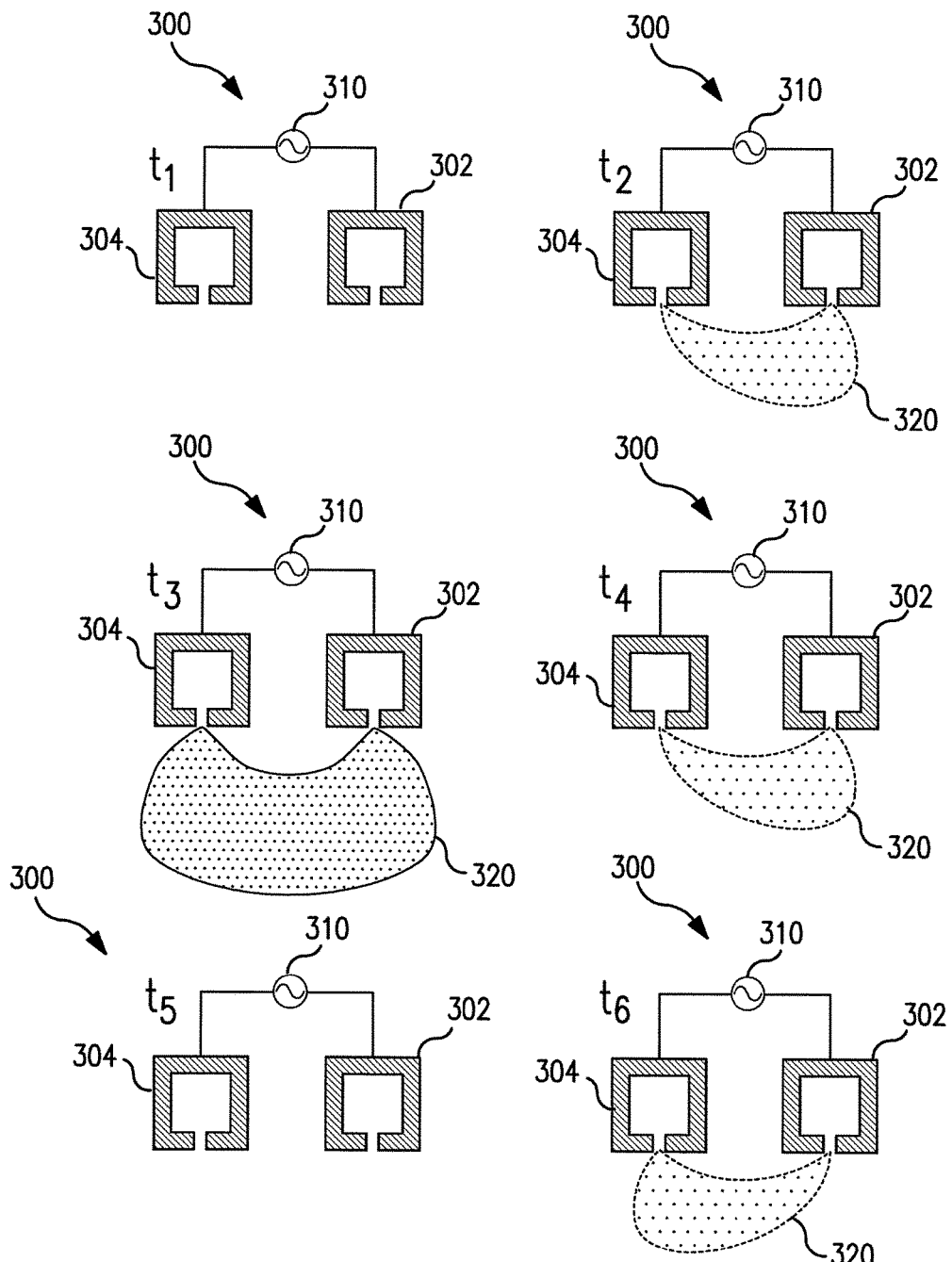
FIG. 3 illustrates a cross-sectional view of a conventional bipolar hollow cathode plasma source at different points in time.

FIG. 3 illustrates a cross-sectional view of a conventional bipolar hollow cathode plasma source at different points in time. Bipolar hollow cathode arrangement 300 includes hollow cathodes 302, 304 and a bipolar power source 310. When power is supplied by power source 310, a plasma 320 is generated between hollow cathodes 302, 304. Voltage plot 202 and current plot 204 indicate, respectively, the voltage and current between hollow cathodes 302, 304. Power source 310 provides an alternating current, and hollow cathodes 302, 304 alternately serve as cathode and anode. In this arrangement, hollow cathodes 302, 304 are in antiphase (i.e., out of phase by 180°). Time points $t_1$, $t_2$, $t_3$, $t_4$, $t_5$, and $t_6$ are indicated on voltage plot 202 and current plot 204 and denote various points of interest, which correspond to the different views of hollow cathode arrangement 300 shown in FIG. 3.

The view corresponding to $t_1$ shows the point where the alternating voltage input and resulting current both reach a zero value. At this point, plasma is not being actively generated. The view corresponding to $t_2$ shows the point where the potential difference between hollow cathodes 302, 304 reaches a maximum and plasma 320 is ignited. The view corresponding to $t_3$ shows the point of maximum current, where plasma 320 is fully established between the two hollow cathodes 302, 304. The view corresponding to $t_4$ shows the bipolar hollow cathode arrangement 300 at a point where current is equal to the current at $t_2$, where a plasma 320 of diminished intensity (compared to, for example, the view corresponding to $t_3$) exists. The view corresponding to $t_5$ shows the next zero crossing, where plasma generation has once again ceased. The view corresponding to $t_6$ shows the continued cycle with plasma 320 again being generated, and where hollow cathode 302 and hollow cathode 304 have switched roles (cathode or anode) as compared to $t_2$.

The switching of roles between cathode and anode is briefly described. The bipolar power supply initially drives a first electron emitting surface to a negative voltage, allowing plasma formation, while the second electron emitting surface is driven to a positive voltage in order to serve as an anode for the voltage application circuit. This then drives the first electron emitting surface to a positive voltage and reverses the roles of cathode and anode. As one of the electron emitting surfaces is driven negative, a discharge forms within the corresponding cavity. The other cathode then forms an anode, causing electron current to flow from the cathodic hollow cathode to the anodic hollow cathode.

Figure 4:
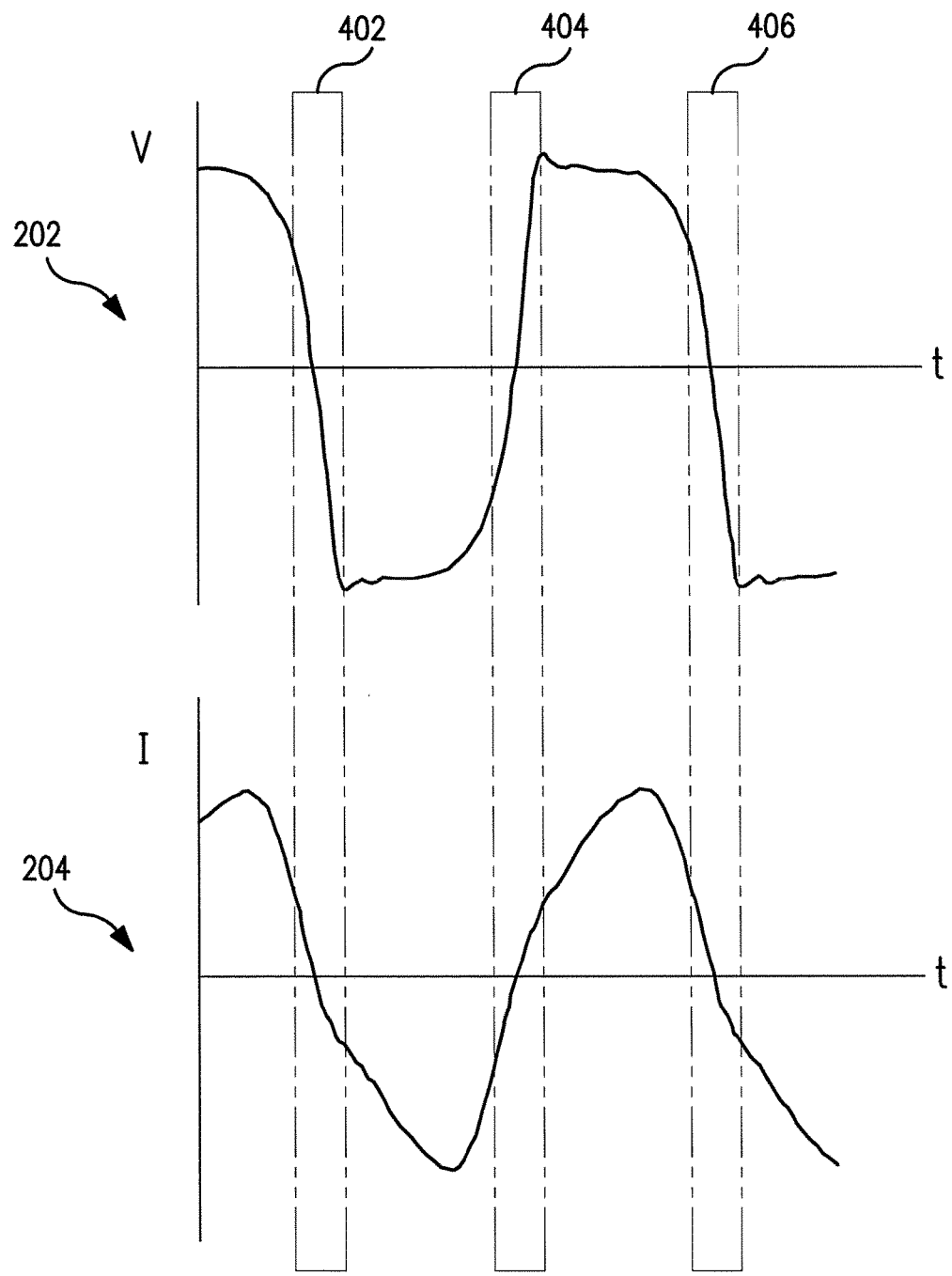
FIG. 4 illustrates regions of plasma off-time in a conventional bipolar hollow cathode plasma source.

FIG. 4 illustrates regions of plasma off-time in a conventional bipolar hollow cathode plasma source. Specifically, FIG. 4 identifies the regions of time along the voltage plot 202 and current plot 204 where insufficient potential difference exists between the hollow cathodes for active plasma formation. In the non-plasma-generating regions 402, 404, and 406, the bipolar hollow cathode arrangement 300 ceases to generate plasma for approximately 25% of each wave period. In contrast, an advantage of embodiments of the present invention is that by maintaining sufficient potential difference between hollow cathodes for plasma generation, embodiments of the present invention are capable of reducing or eliminating the period of time where there is no plasma being formed.

Figure 5:
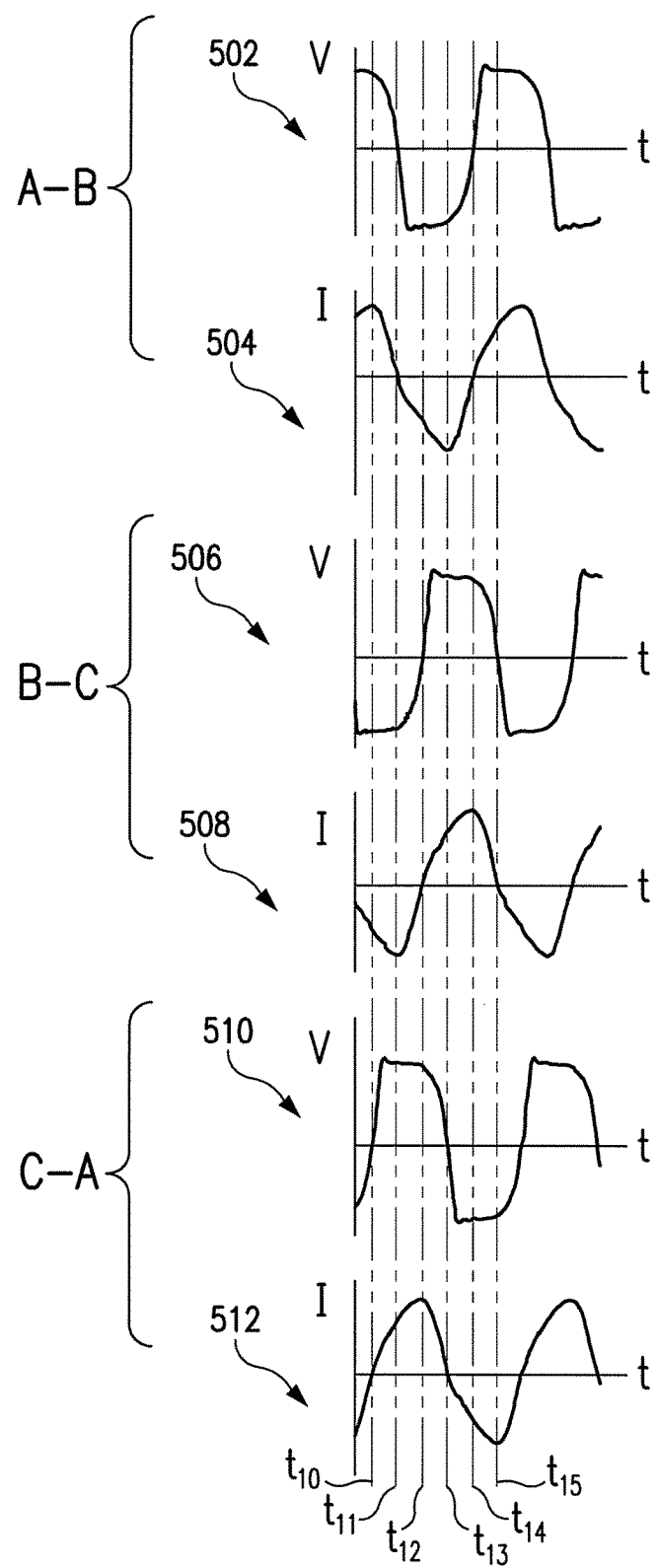
FIG. 5 illustrates voltage and current plots between pairs of hollow cathodes in a multiphase hollow cathode plasma source according to exemplary embodiments of the present invention.

FIG. 5 illustrates voltage and current plots between pairs of hollow cathodes in a multiphase hollow cathode plasma source according to embodiments of the present invention. Time points $t_{10}$, $t_{11}$, $t_{12}$, $t_{13}$, $t_{14}$, and $t_{15}$ are indicated on voltage plots 502, 506, 510 and current plots 504, 508, 512 and denote various points of interest.

Figure 6:
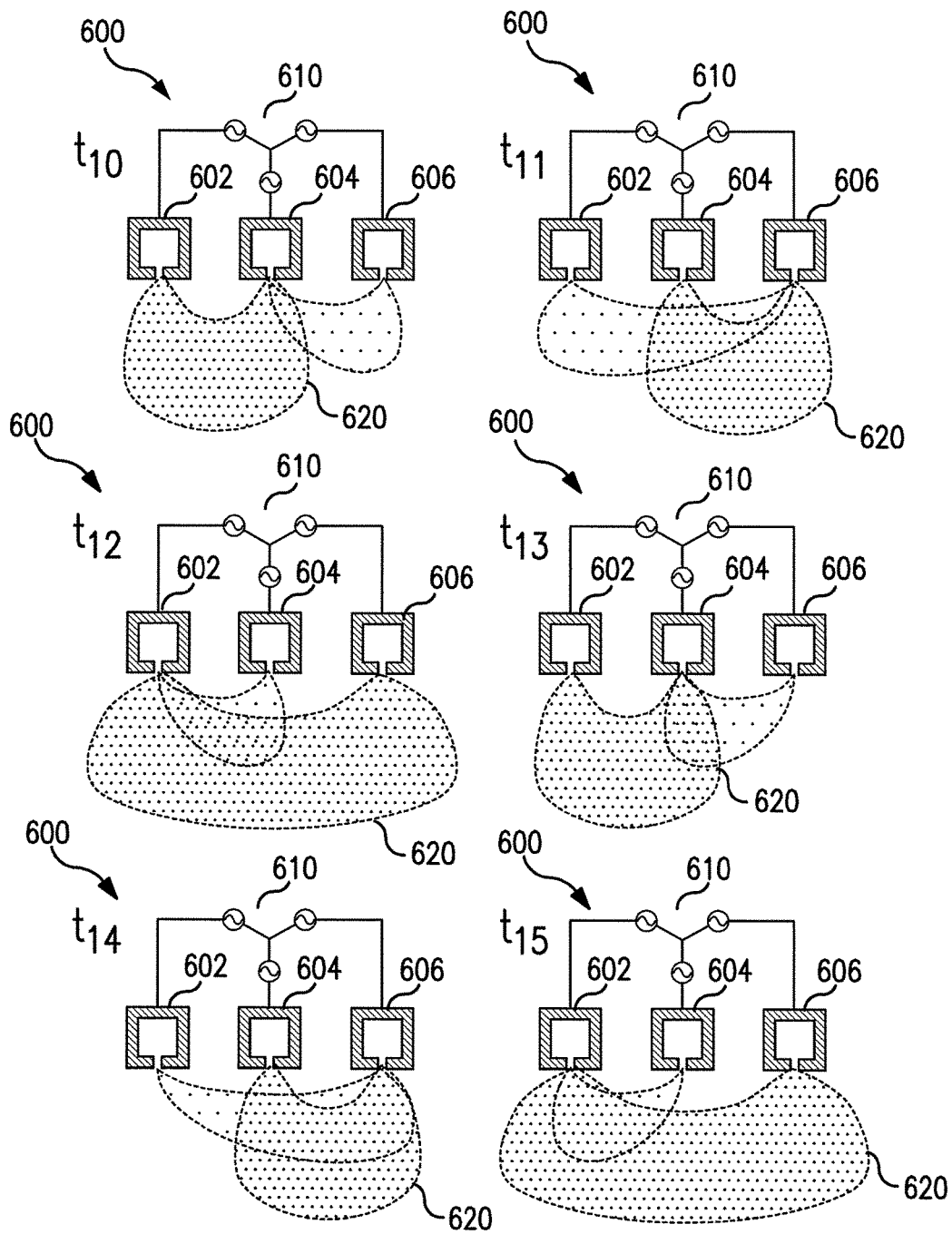
FIG. 6 illustrates a cross-sectional view of a multiphase hollow cathode plasma source at different points in time according to exemplary embodiments of the present invention.

FIG. 6 illustrates a cross-sectional view of a multiphase hollow cathode plasma source at different points in time according to embodiments of the present invention. Multiphase hollow cathode arrangement 600 includes hollow cathodes 602, 604, 606 and a multiphase power source 610. When power is supplied by power source 610, a plasma 620 is generated between hollow cathodes 602, 604, 606. Specifically, plasma 620 is generated between each pair of hollow cathodes 602, 604; 604, 606; and 602, 606. Voltage plots 502, 506, 510 and current plots 504, 508, 512 (as shown in FIG. 5) indicate, respectively, the voltage and current between hollow cathode pairs 602, 604 (labeled "A-B" in FIG. 5); 604, 606 (labeled "B-C" in FIG. 5); and 602, 606 (labeled "A-C" in FIG. 5) (hollow cathode pairs as shown in FIG. 6). Power source 610 provides an alternating current, and hollow cathodes 602, 604, 606 alternately serve as cathode and anode. In this arrangement, hollow cathode pairs 602, 604 and 604, 606 are out of phase by +120° and hollow cathode pair 602, 606 is out of phase by −120°. Time points $t_{10}$, $t_{11}$, $t_{12}$, $t_{13}$, $t_{14}$, and $t_{15}$ are indicated on voltage plots 502, 506, 510 and current plots 504, 508, 512 and denote various points of interest, which correspond to the different views of hollow cathode arrangement 600 shown in FIG. 6.

The plasma generated between any pair of hollow cathodes will be affected, in part, by the distance between the pair of hollow cathodes. In some embodiments, the distance between adjacent pairs of hollow cathodes (e.g., hollow cathode pairs 602, 604 and 604, 606) is the same, or substantially the same, while the distance between non-adjacent hollow cathodes (e.g. hollow cathodes 602, 606) is greater than the distance between adjacent pairs. If the distance between a pair of hollow cathodes is too large, plasma may not be formed between them. As will be recognized by one of skill in the art, distance between hollow cathodes is process dependent. As distance increases, the voltage required for plasma formation increases. In some embodiments, the distance between hollow cathodes is less than 500 mm, or less than 400 mm, or less than 200 mm. In some embodiments, the distance between hollow cathodes is about 100 mm. Although plasma formation can occur for larger distances, for typical processes and power supplies, a maximum distance might be 500 mm. Magnetic fields can also influence effective spacing ranges.

The plasma generated will also be affected, in part, by the voltage and current between the pair of hollow cathodes. For example, although plasma may be forming between multiple pairs of hollow cathodes, the plasma density may not be uniform, in part due to the difference in voltage and current between different pairs of hollow cathodes. For use in coating a substrate using plasma-enhanced chemical vapor deposition, for example, this non-uniformity will not be substantial, because the non-uniformities occur only during a short time span and the higher and lower plasma density areas switch many times before the substrate will have moved appreciably. Further, for inline coating processes, because the substrate moves beneath the plasma source and passes under each hollow cathode, the substrate will be equally treated.

Multiphase power source 610 may include a single power source or multiple power sources. Specifically, multiphase power source 610 is capable of generating multiple output waves (e.g., waves A, B, and C in waveform plot 100), where the multiple output waves (and hence, the hollow cathodes that those waves power) are each phase-shifted from one another with respect to time. In some embodiments, adjacent hollow cathodes e.g. hollow cathode pairs 602, 604 and 604, 606) are each phase shifted by the same phase angle from each other (e.g. 120° for a three-phase power source, 90° for a four-phase power source, 72° for a five-phase power source, 60° for a six-phase power source, 360°/n for an n-phase power source). For a three-phase three-hollow-cathode linear embodiment (i.e. hollow cathodes are arranged in a line), if each adjacent hollow cathode pair 602, 604 and 604, 606 is out of phase by 120°, then non-adjacent hollow cathode pair 602, 606 would be out of phase by −120°. For a four-phase four-hollow-cathode linear embodiment, if each adjacent pair is out of phase by 60°, then the non-adjacent pair consisting of the first and third hollow cathodes in the line would be out of phase by 120° and the non-adjacent pair consisting of the first and the fourth hollow cathodes in the line would be out of phase by 180°.

The view corresponding to $t_{10}$ shows the point where current flow between hollow cathodes 602 and 604 is at a maximum, while current flow between hollow cathodes 604 and 606 is approximately half of the maximum value. In the view corresponding to $t_{11}$, current flow between hollow cathodes 602 and 604 becomes zero while current begins flowing between hollow cathodes 602 and 606. At this same point ($t_{11}$), current flow between hollow cathodes 604 and 606 reaches its maximum value. The cycle continues in the view corresponding to $t_{12}$, when current flow between hollow cathodes 602 and 606 reaches a maximum value and current again begins to flow between hollow cathodes 602 and 604, though in the opposite direction from that depicted in the view corresponding to $t_{10}$. The view corresponding to $t_{13}$ depicts the opposite end of the cycle from the view corresponding to $t_{10}$, where maximum current flows between hollow cathode 602 and 604, while approximately half of the maximum current flows between hollow cathodes 604 and 606. The current flows of the view corresponding to $t_{13}$ are in the opposite directions of those in the view corresponding to $t_{10}$, with the hollow cathodes that previously served as cathodes now serving as anodes. The view corresponding to $t_{14}$ depicts the opposite current flow situation of what was described in the view corresponding to $t_{11}$, and the view corresponding to $t_{15}$ shows the opposite current flow situation of what was described in the view corresponding to $t_{12}$.

One characteristic of the multiphase hollow cathode arrangement 600 depicted in FIG. 6 (as well as in other embodiments of the present invention) is that at each point when current flow approaches zero between any two hollow cathodes, the voltage difference and current flow between other hollow cathode pairs is nonzero. With this arrangement, it is possible to create a plasma device which does not experience the previously mentioned plasma off-time of conventional plasma sources driven by bipolar power. That is, embodiments of the present invention effectively avoid the non-plasma generating regions 402, 404, 406 inherent in the prior art bipolar hollow cathode arrangement 300, as discussed above. By including at least three hollow cathodes and a multiphase power source, according to embodiments of the present invention, improved plasma characteristics may be obtained, including a device which maintains current flow and the resultant plasma generation for the entirety of its operational time, thereby producing continuous plasma generation. By using at least three phase-offset waves and at least three hollow cathodes, there will be substantially no plasma off-time where the waves are generated by an alternating current power source. For pulsed power, the plasma off-time may be from substantially 0% to around 20%, depending on design parameters. For example, using pulsed power with at least three phase-offset waves and at least three hollow cathodes, the plasma off-time may be substantially 20% (or alternatively, active plasma generation for 80% of a period of the waves); the plasma off-time may be substantially 10% (or alternatively, active plasma generation for 90% of a period of the waves); the plasma off-time may also be substantially 0% (or alternatively, active plasma generation for 100% of a period of the waves). Because there is a decay time associated with plasma—i.e., even after voltage drops to zero between a pair of hollow cathodes, plasma may still be present for a short time thereafter, even though it is not being actively generated—this application refers to active plasma generation as the time where there is active electron emission.

In some embodiments, hollow cathodes 602, 604, 606 (or any other hollow cathode arrangement described in or enabled by this specification) may include elongated cavities. The hollow cathodes may include a plasma exit region, and the plasma exit region may include a single plasma exit orifice or a plurality of plasma exit orifices or an plasma exit slot or some combination of these plasma exit regions. In some embodiments, the hollow cathodes are each electrically insulated such that only interior surfaces of the hollow cathode and the plasma exit region are electron-emitting and -accepting. In some embodiments, virtually all the continuously generated plasma flows through the plasma exit region of each of the hollow cathodes. In some embodiments, current flow is comprised of secondary electron emission or thermionic-emitted electrons or some combination of these current flows. In some embodiments, an electric potential difference causes current to flow between the hollow cathodes. In some embodiments, this potential difference is at least 50V or at least 200V between any two of the hollow cathodes. In some embodiments, the multiphase power source that produces multiple output waves produces multiple output waves comprised of square waves, whereby the electric potential difference is reduced relative to sinusoidal waves. The multiphase power source is in the form of AC electrical energy or in the form of pulsed electrical energy or some combination of these forms of electrical energy. In some embodiments, the plasma that is generated is substantially uniform over its length in the substantial absence of magnetic-field driven closed circuit electron drift. In some embodiments, the plasma is made substantially uniform over its length from about 0.1 m to about 1 m or from about 1 m to about 4 m. In some embodiments, the frequencies of each of the multiple output waves are equal and are in the range of from about 1 kHz to about 1 MHz or from about 10 kHz to about 200 kHz or from about 20 kHz to about 100 kHz. In some embodiments, the electrons emitted from an emitting surface are confined by the hollow cathode effect. In some embodiments, the electrons emitted from an emitting surface are not confined by magnetic fields.

One factor influencing electron current is the temperature of hollow cathode cavity walls. In a hollow cathode setup with cavity wall temperature below 1000° C., electron emission is dominated by secondary electron emission. As cavity walls are bombarded by ions, the impacting ion kinetic energy along with a negative voltage potential induces electrons to be emitted from wall surfaces. Typically, these "cold" hollow cathodes are run with cavity wall temperatures from 50° C. to 500° C. Generally, to maintain hollow cathode structures at these temperatures, cooling methods are applied. Often, water cooling channels are built into the hollow cathode structure. Operating voltage for cold hollow cathode discharges is typically from 300 volts to 1000 volts.

Alternatively, hollow cathodes may be run in thermionic mode. For thermionic electron emission to occur, hollow cathode cavity wall temperatures usually range from 1000° C. to 2000° C. Thermionic hollow cathodes may incorporate heaters around cavity walls to help raise temperature or, more simply, may rely on plasma energy transfer to heat cavity walls. Generally, hot cavities are thermally insulated to reduce conductive or radiative heat loss. Operating voltage for thermionic hollow cathode discharges is typically from 10 volts to 300 volts or more commonly from 10 volts to 100 volts.

Commercially useful PECVD processes with sufficiently high deposition rates depend on plasmas that have undergone some method of densification. The hollow cathode effect is a specific method of electron densification and confinement making use of enclosed or partially enclosing electric fields. Gas phase free electrons are trapped by enclosing negative fields and exhibit oscillating movement between the surrounding or facing negatively biased walls. Electron oscillations result in long electron path lengths which in turn result in high probability of gas phase collisions. These collisions ionize the gas molecules creating additional electrons and positive ions. The positive ions are accelerated to and collide with the negatively biased hollow cathode walls. The positive ion-wall collisions result in further electron generation through secondary electron emission. Literature indicates hollow cathode plasmas are generally denser plasmas than those derived from magnetic confinement such as is used in closed drift electron confinement processes (e.g., magnetron sputtering).

Another advantage of the embodiment in FIG. 6, as well as other embodiments of the present invention, is that by including additional hollow cathodes a wider plasma is generated, which results in improved PECVD deposition rate.

Figure 7:
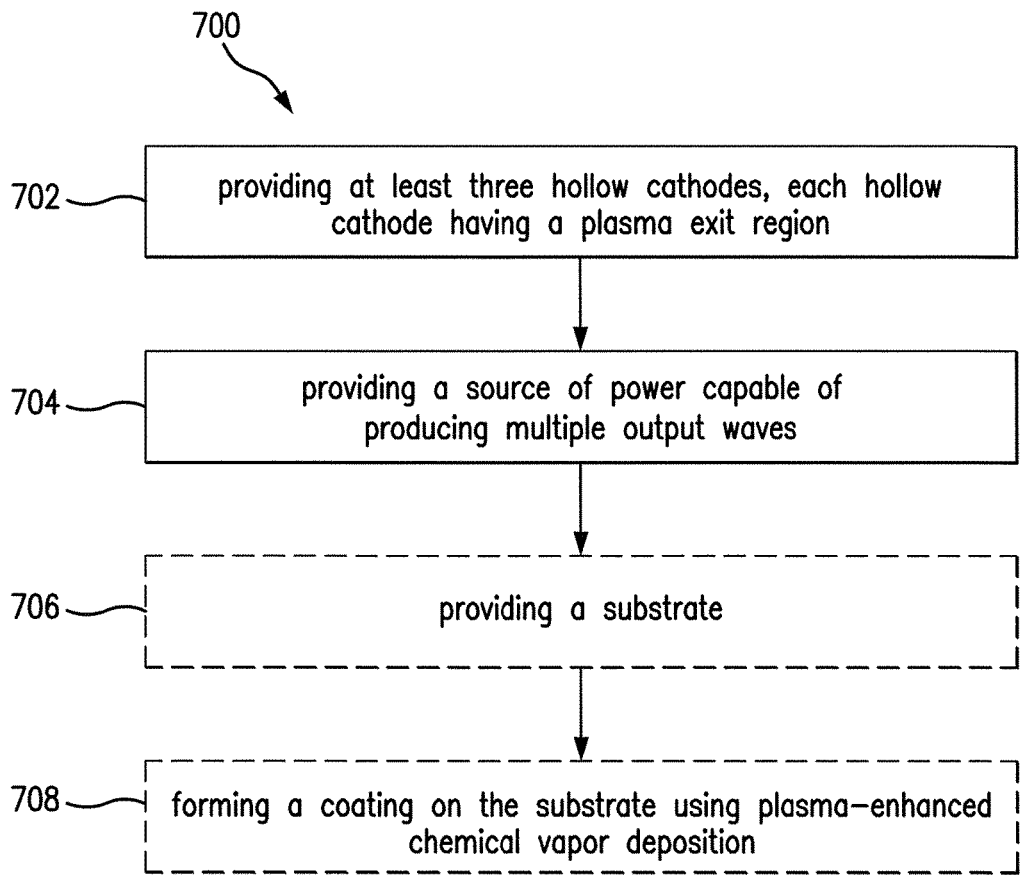
FIG. 7 illustrates a method according to exemplary embodiments of the present invention.

FIG. 7 illustrates a method according to embodiments of the present invention. The multiphase hollow cathode arrangement 600 (and other hollow cathode arrangements described and enabled by this disclosure) may be used to generate a continuous plasma. A method 700 of producing a plasma includes providing at least three hollow cathodes (step 702). Each hollow cathode has a plasma exit region. The method also includes providing a source of power capable of producing multiple output waves (step 704). Each hollow cathode is electrically connected to the source of power. The multiple output waves produced by the source of power are each phase-shifted from one another with respect to time to cause each hollow cathode to be out of electrical phase with the other hollow cathodes. Electrical current flows between the at least three hollow cathodes that are out of electrical phase. A plasma is continuously generated between the hollow cathodes. In some embodiments, the method further includes providing a substrate (step 706) and forming a coating on the substrate using plasma-enhanced chemical vapor deposition (step 708). The dashed boxes around steps 706 and 708 in FIG. 7 indicate that these steps are optional. Forming a coating on the substrate using plasma-enhanced chemical vapor deposition (PECVD) may include providing precursor gasses, process gasses, reactant gasses, or a combination of these, into the hollow cathode cavities or through manifolds adjacent to the hollow cathodes. Those of skill in the art will recognize that other steps applicable to PECVD may also be included.

Figure 8:
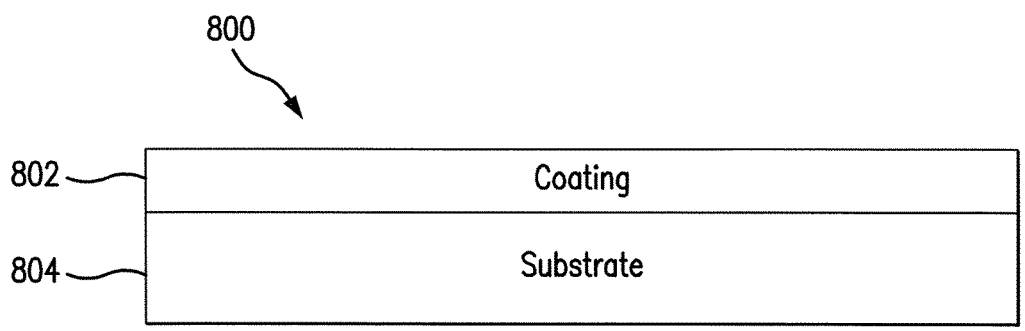
FIG. 8 illustrates a coating formed by methods according to exemplary embodiments of the present invention.

FIG. 8 illustrates a coating formed by methods according to embodiments of the present invention. Coating 802 is formed on top of substrate 804, creating a coating-substrate combination 800. In some embodiments, substrate 804 is glass. In other embodiments, substrate 804 may include plastic, metal, semiconductor material, or other suitable material for use in a PECVD process. In some embodiments, coating 802 may be a single layer or film or may include a plurality of layers or films. In some embodiments, coating 802 may be a low-emissivity coating and substrate 804 may be a glass window, such that coating-substrate combination 800 is suitable for architectural use. In some embodiments, coating 802 may be another coating for a specific application, such as an anti-fog coating for use in refrigerator doors or a transparent conductive oxide coating for use in photovoltaic cells.

Figure 9:
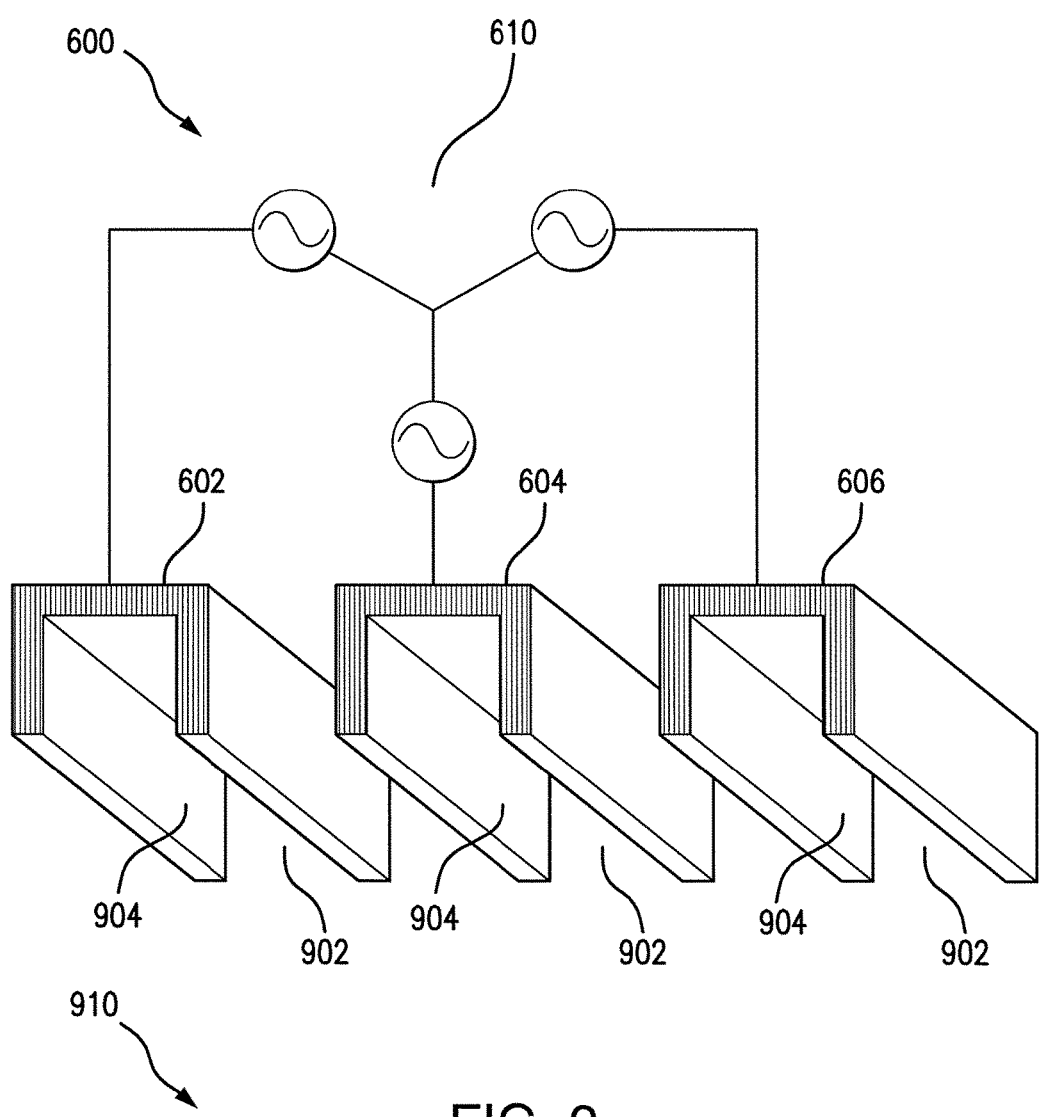
FIG. 9 illustrates a multiphase hollow cathode plasma source including hollow cathodes having a plasma exit region according to exemplary embodiments of the present invention.

FIG. 9 illustrates a multiphase hollow cathode plasma source including hollow cathodes having a plasma exit region according to embodiments of the present invention. Linear multiphase hollow cathode arrangement 600 (shown in FIG. 9) includes hollow cathodes 602, 604, 606 and multiphase power source 610. Each hollow cathode 602, 604, 606 is powered from the multiphase power source 610 by alternating or pulsed power such that each hollow cathode is phase offset from one another. Each hollow cathode 602, 604, 606 includes a hollow cathode cavity 904 and plasma outlet 902. In the embodiment shown in FIG. 9, hollow cathodes 602, 604, 606 include two spaced-apart side regions and a top region, defining the cavity 904, and an open bottom region defining the plasma outlet 902. A reactant gas (or process gas or precursor gas or a combination of these gasses) may be present in hollow cathode cavity 904 of each hollow cathode 602, 604, 606. A reactant gas (or process gas or precursor gas or a combination of these gasses) may also be present in a reaction region 910. In some embodiments, reaction region 910 may include a substrate, such as substrate 804, and in some embodiments, a coating may be formed on the substrate in reaction region 910. When power is supplied by multiphase power source 610, electrons alternately flow between each of the hollow cathodes 602, 604, 606, generating plasma which flows out of plasma outlets 902 into reaction region 910.

Figure 10:
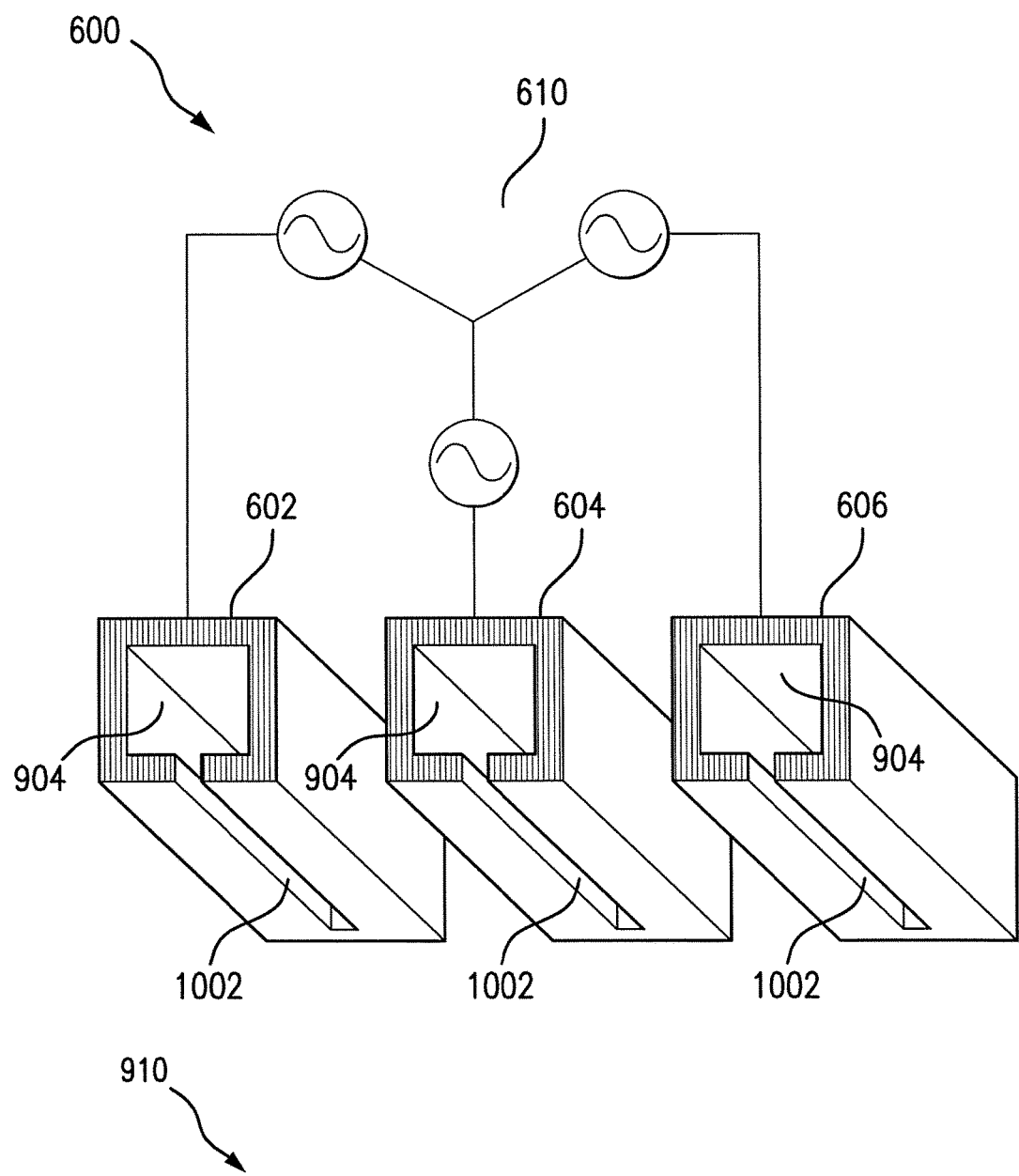
FIG. 10 illustrates a multiphase hollow cathode plasma source including hollow cathodes having a slot-like, restricted plasma exit region according to exemplary embodiments of the present invention.

FIG. 10 illustrates a multiphase hollow cathode plasma source including hollow cathodes having a slot-like, restricted plasma exit region according to embodiments of the present invention. The embodiment of FIG. 10 is an alteration of the embodiment of FIG. 9, where plasma outlet 902 is replaced by a slot-like plasma outlet 1002. Each hollow cathode 602, 604, 606 includes a hollow cathode cavity 904 and plasma outlet 1002. In the embodiment shown in FIG. 10, hollow cathodes 602, 604, 606 include two spaced-apart side regions and a top region spaced apart from a bottom region, such that plasma outlet 1002 is defined by a slot in the bottom region. The plasma outlet 1002 allows for higher gas pressure inside of the hollow cathodes 602, 604, 606 when process gas is inside the hollow cathode cavity 904.

As described above, a multiphase plasma source according to embodiments of the invention can include three hollow cathodes, each phase shifted from each other, i.e. three-phase, three-hollow-cathode embodiments. One of skill in the art will recognize that other embodiments are possible, such as four-, five-, or six-phase embodiments, and that in general, a multiphase hollow cathode arrangement can be provided for an n-phase embodiment, where n is greater than 2. Using additional hollow cathodes and phase-shifted waves enables the creation of a plasma with the desired characteristics for a given process or use. As the embodiments in FIGS. 9 and 10 show (and as described below), an n-phase hollow cathode arrangement, according to embodiments of the present invention, may include m hollow cathodes, where n is less than or equal to m. For a system with m hollow cathodes, there will be $\binom{m}{2}$ pairs of hollow cathodes (irrespective of order). Thus, for example, to show representative voltage and current plots analogous to those shown in FIG. 5 for a three-hollow-cathode embodiment, would require 15 voltage plots and 15 current plots for m=6 ($\binom{6}{2}$=15). Where the hollow cathodes are arranged linearly, there will be m−1 adjacent pairs of hollow cathodes. Having fewer phases which drive multiple hollow cathodes can simplify the requirements for a multiphase power source, and can also alter the characteristics of the plasma generated as a function of time, as a person of ordinary skill in the art will understand from the present disclosure.

Figure 11:
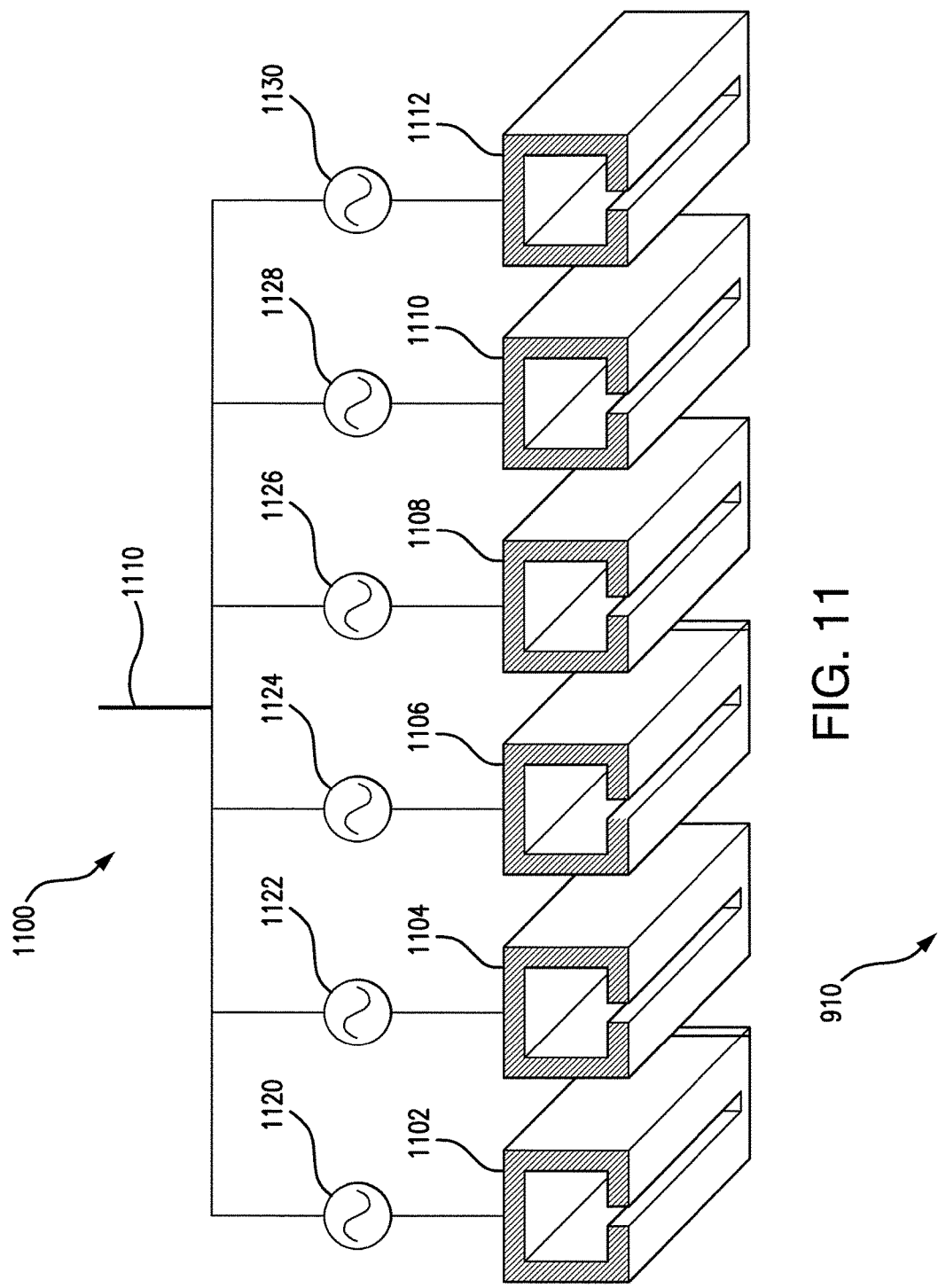
FIG. 11 illustrates a multiphase hollow cathode plasma source including six hollow cathodes and six phases according to exemplary embodiments of the present invention.

FIG. 11 illustrates a multiphase hollow cathode plasma source including six hollow cathodes and six phases according to embodiments of the present invention. That is, in this embodiment m=6 and n=6. Multiphase hollow cathode arrangement 1100 includes hollow cathodes 1102, 1104, 1106, 1108, 1110, 1112 connected to a multiphase power source 1110 configured to power each hollow cathode with a separate phase-offset wave 1120, 1122, 1124, 1126, 1128, 1130. In one embodiment, adjacent hollow cathode pairs are each phase shifted from one another by the same phase angle (e.g. by 60°). Adjacent hollow cathode pairs, as shown in FIG. 11, include hollow cathode pairs 1102, 1104; 1104, 1106; 1106, 1108; 1108, 1110; and 1110, 1112. In the embodiment shown in FIG. 11, where adjacent pairs are out of phase by 60°, non-adjacent pairs 1102, 1108; 1104, 1110; and 1106, 1112 are each in antiphase with respect to each other. There are 10 non-adjacent pairs in the embodiment of FIG. 11 ($\binom{6}{2}$−(6−1)=15−5=10). The phase difference of each pair of hollow cathodes in FIG. 11, where adjacent pairs are phase shifted by 60°, is shown in the table below.

TABLE 1

| Pair | Offset |
|---|---|
| 1102, 1104 | 60° |
| 1102, 1106 | 120° |
| 1102, 1108 | 180° |
| 1102, 1110 | −120° |
| 1102, 1112 | −60° |
| 1104, 1106 | 60° |
| 1104, 1108 | 120° |
| 1104, 1110 | 180° |
| 1104, 1112 | −120° |
| 1106, 1108 | 60° |
| 1106, 1110 | 120° |
| 1106, 1112 | 180° |
| 1108, 1110 | 60° |
| 1108, 1112 | 120° |
| 1110, 1112 | 60° |

Figure 12:
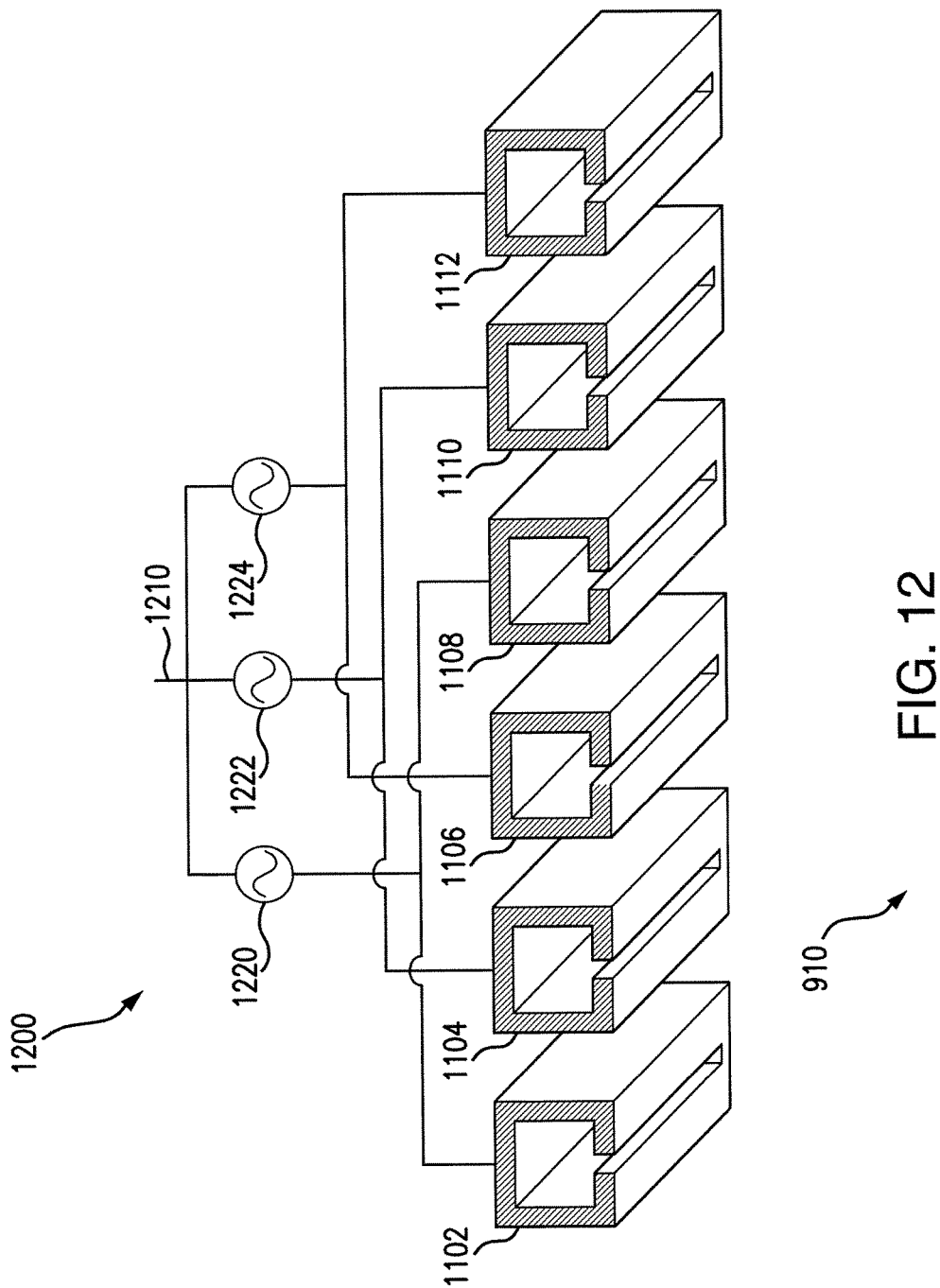
FIG. 12 illustrates a multiphase hollow cathode plasma source including six hollow cathodes and three phases according to exemplary embodiments of the present invention.

FIG. 12 illustrates a multiphase hollow cathode plasma source including six hollow cathodes and three phases according to embodiments of the present invention. That is, in this embodiment, m=3 and n=6. Hollow cathode arrangement 1200 includes hollow cathodes 1102, 1104, 1106, 1108, 1110, 1112 connected to multiphase power source 1210. Multiphase power source 1210 produces three phase-offset waves 1220, 1222, 1224. In this embodiment, wave 1220 powers hollow cathodes 1102, 1108; wave 1222 powers hollow cathodes 1104, 1110; and wave 1224 powers hollow cathodes 1106, 1112. In some embodiments, each wave 1220, 1222, 1224 is offset by the same phase angle (e.g., 120°). In the embodiment shown in FIG. 12, non-adjacent pairs 1102, 1108; 1104, 1110; and 1106, 1112 are each in phase with respect to each other, since there is a single wave 1220, 1222, 1224 powering each pair. The phase difference of each pair of hollow cathodes in FIG. 12, where adjacent pairs are phase shifted by 120°, is shown in the table below.

TABLE 2

| Pair | Offset |
| --- | --- |
| 1102, 1104 | 120° |
| 1102, 1106 | −120° |
| 1102, 1108 | 0° |
| 1102, 1110 | 120° |
| 1102, 1112 | −120° |
| 1104, 1106 | 120° |
| 1104, 1108 | −120° |
| 1104, 1110 | 0° |
| 1104, 1112 | 120° |
| 1106, 1108 | 120° |
| 1106, 1110 | −120° |
| 1106, 1112 | 0° |
| 1108, 1110 | 120° |
| 1108, 1112 | −120° |
| 1110, 1112 | 120° |

Figure 13:
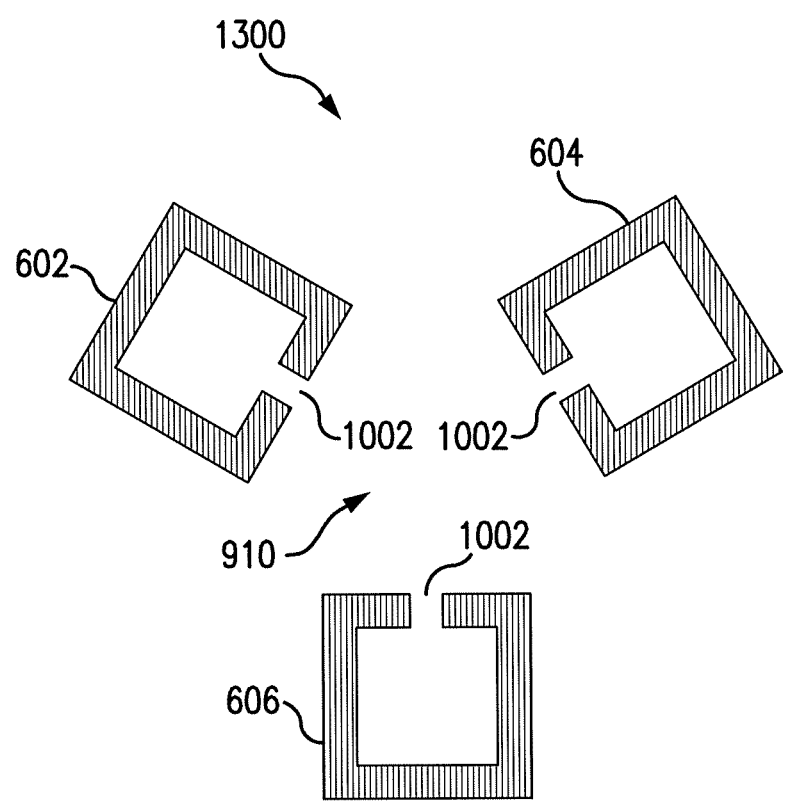
FIG. 13 illustrates a multiphase hollow cathode plasma source including three equidistant hollow cathodes according to exemplary embodiments of the present invention.

FIG. 13 illustrates a multiphase hollow cathode plasma source including three equidistant hollow cathodes. Arrangement 1300 includes three hollow cathodes 602, 604, 606 with plasma outlets 1002 each directed to a common line (note that because FIG. 13 is a cross-sectional view, it appears that each of the outlets is directed to a common point). As will be apparent, the embodiment shown in FIG. 13 can also include additional hollow cathodes, in various geometric configurations, such that the plasma outlets of each of the hollow cathodes (or some subset of the hollow cathodes) are directed to a common line (or a set of common lines). In some embodiments, the distance between each of the hollow cathodes (adjacent and non-adjacent) is equal. For example, FIG. 13 shows a distance between hollow cathode pair 602, 604 being substantially the same as a distance between each of hollow cathode pair 602, 606 and hollow cathode pair 604, 606. In some embodiments, a distance between hollow cathode pairs may be measured from the center of a hollow cathode, from the plasma outlet of a hollow cathode, or from some other point in, on, or near a hollow cathode. The embodiment of FIG. 13, or similar embodiments, may be used, for example, to coat two-dimensional substrates such as wire or optical fiber coating. For example, two-dimensional substrates may be coated uniformly by passing these elongated substrates through the line of common direction.

Figure 14A:
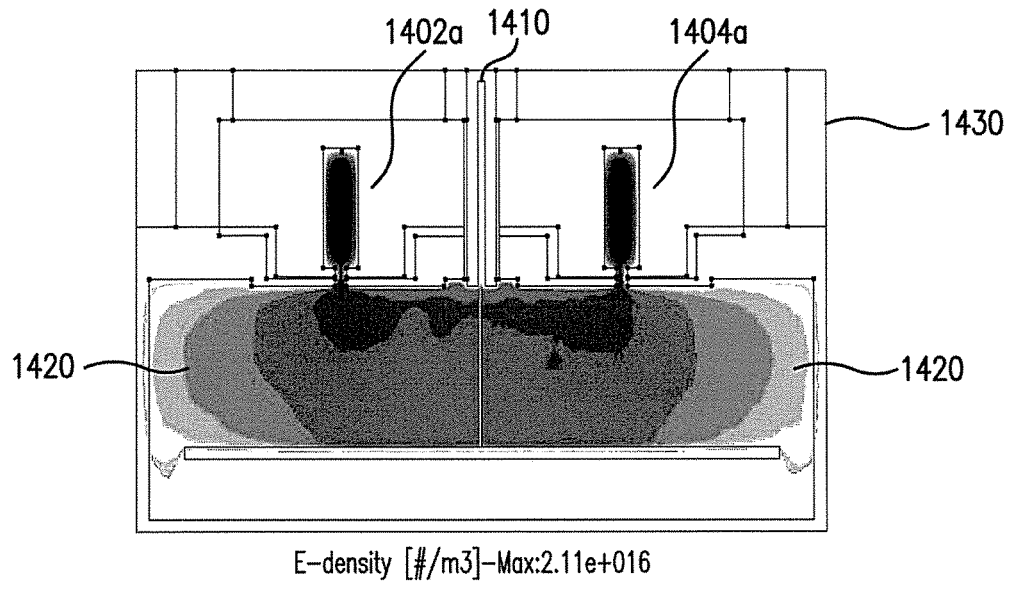
FIG. 14A illustrates electron density of the plasma formation in and around the hollow cathodes in a bipolar hollow cathode plasma source.
Figure 14B:
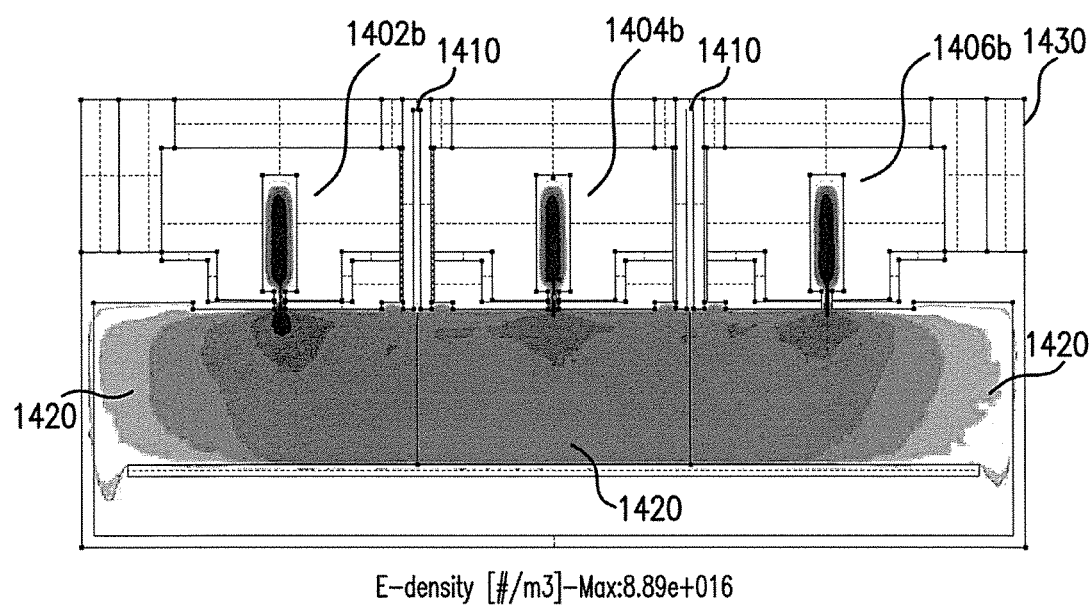
FIG. 14B illustrates electron density of the plasma formation in and around the hollow cathodes in a multiphase hollow cathode plasma source according to exemplary embodiments of the present invention.

FIGS. 14A and 14B illustrate electron density of the plasma formation in and around the hollow cathodes in both a bipolar hollow cathode plasma source and a multiphase hollow cathode plasma source according to embodiments of the present invention. As the figures illustrate, for comparable levels of electron density outside of the hollow cathode cavities, in the reaction region—as between the bipolar (FIG. 14A) and multiphase plasma sources (FIG. 14B)—the electron density inside the hollow cathode cavities is significantly greater for the bipolar plasma source relative to the multiphase plasma source.

Figure 15A:
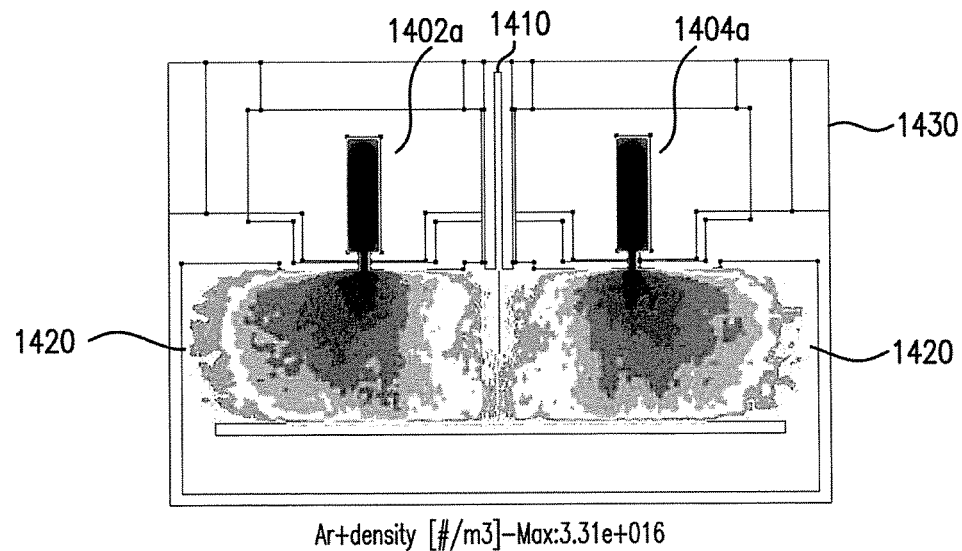
FIG. 15A illustrates ion density of the plasma formation in and around the hollow cathodes in a bipolar hollow cathode plasma source.
Figure 15B:
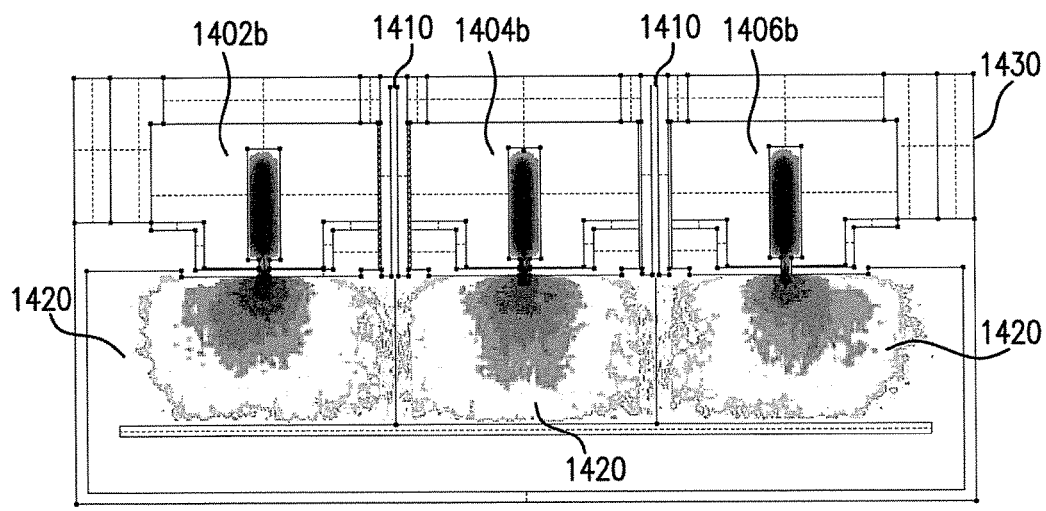
FIG. 15B illustrates ion density of the plasma formation in and around the hollow cathodes in a multiphase hollow cathode plasma source according to exemplary embodiments of the present invention.

FIGS. 15A and 15B illustrate ion density of the plasma formation in and around the hollow cathodes in both a bipolar hollow cathode plasma source and a multiphase hollow cathode plasma source according to embodiments of the present invention. As the figures illustrate, for comparable levels of ion density outside of the hollow cathode cavities, in the reaction region—as between the bipolar (FIG. 15A) and multiphase plasma sources (FIG. 15B)—the ion density inside the hollow cathode cavities is significantly greater for the bipolar plasma source relative to the multiphase plasma source.

Figure 16A:
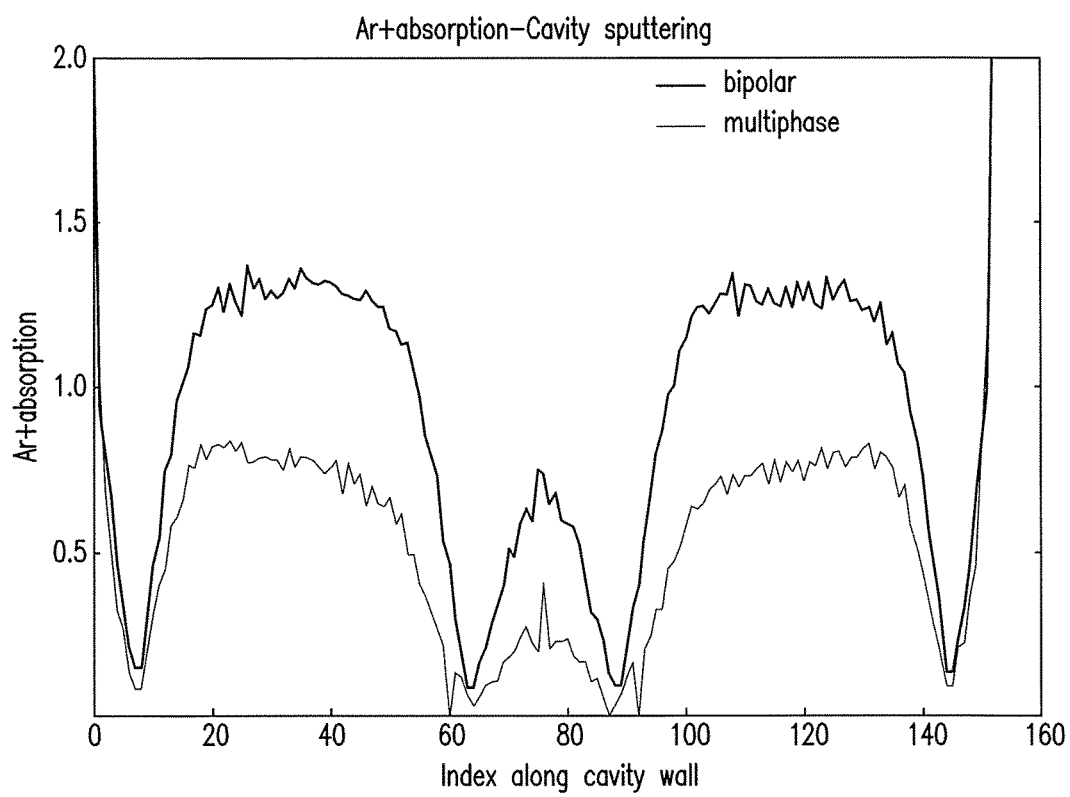
FIG. 16A illustrates ion absorption along the wall of a hollow cathode cavity in both a bipolar hollow cathode plasma source and a multiphase hollow cathode plasma source according to exemplary embodiments of the present invention.

FIG. 16A illustrates ion absorption along the wall of a hollow cathode cavity in both a bipolar hollow cathode plasma source and a multiphase hollow cathode plasma source according to embodiments of the present invention. As the figure illustrates, the ion absorption along the wall of a hollow cathode cavity is significantly greater for the bipolar plasma source relative to the multiphase plasma source. The figure also illustrates that the ion absorption is at a minimum at the corners of the hollow cathode cavity (index values 8, 63, 89, 144). According to the figure, the absorption rate is approximately 88% less for the multiphase arrangement compared to the bipolar arrangement (this value will vary depending on, for example, power levels used during operation of the plasma source).

Figure 16B:
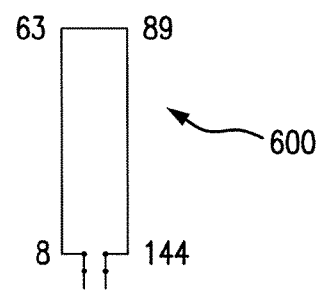
FIG. 16B illustrates an index along a wall of a hollow cathode cavity as shown in the graph of FIG. 16A.

FIG. 16B illustrates an index along a wall of a hollow cathode cavity as shown in the graph of FIG. 16A. Specifically, the values shown along the wall of the hollow cathode cavity 600 in FIG. 16B correspond to values on the x axis of FIG. 16A ("Index along cavity wall").

FIGS. 14-16B were generated as the results of a simulation of both a bipolar hollow cathode arrangement (similar to arrangement 300) and a multiphase hollow cathode arrangement (similar to arrangement 600). For example, with reference to FIGS. 14A and 15A, the bipolar arrangement comprises two linear hollow cathodes 1402a, 1404a (in antiphase) located in a vacuum chamber 1430. Precursor gas flows through the precursor manifold 1410. Plasma is formed in reaction region 1420. Referring now to FIGS. 14B and 15B, the multiphase arrangement comprises three linear hollow cathodes 1402b, 1404b, 1406b (each phase offset from each other by 120°), located in a vacuum chamber 1430. Precursor gas flows through the precursor manifolds 1410. Plasma is formed in reaction region 1420. The simulation setup is further described below. Argon gas was used as the process gas in the hollow cathode cavities. In accordance with embodiments of the present invention, other process gasses can also be used, including without limitation Oxygen, Nitrogen, Argon, Helium, Krypton, Neon, Xenon, Hydrogen, Fluorine, Chlorine, and mixtures thereof. Reactive gasses include H2, H20, H202, N2, N02, N20, NH3, CH4, CO, CO2, SH2, other sulfur based gases, halogens, bromines, phosphorous based gases, or mixtures thereof.

Specifically, it is apparent from FIGS. 14-16B that for the same levels of plasma density in the plasma generation region outside of the hollow cathodes between a two-phase and three-phase arrangement, the level of wear (as indicated by plasma and ion density and ion absorption) inside the hollow cathode cavities is significantly less for a three-phase arrangement according to embodiments of the present invention. In embodiments of the present invention, this may lead to a longer operational life of the hollow cathodes relative to a bipolar plasma source. Operational life will depend on what process the plasma source is being used for, among other factors. For typical PECVD applications relating to glass coatings, the expected operational run-life improvement for a three-phase three-hollow-cathode arrangement is approximately 60% greater as compared to the conventional bipolar arrangement. In some embodiments, this may equate to approximately 200 hours of additional life, for example, an operational life of 500 hours over a baseline of 300 hours. This advantage is attributable to the multiphase power arrangement, and is not a result of merely adding additional hollow cathodes.

The inventors have found that the amount of sputtering of the hollow cathode cavity surfaces is related to the absorption of reactive ions on the hollow cathode cavity surfaces as determined by numerical simulation.

The simulation software that was used for simulating gas flows and gas discharges is a program called PIC-MC that has been developed by the Fraunhofer-Institute for Surface Engineering and Thin Films IST, Braunschweig, Germany. The software combines the simulation of gas flows, magnetic fields, and plasma. For the gas flow simulation it uses the Direct Simulation Monte Carlo (DSMC), for the magnetic field simulation it uses the Boundary Element Method (BEM) and for the plasma simulation it uses the Particle in Cell—Monte Carlo method (PIC-MC).

The simulations were made on a pseudo 2D model which is a transversal 1.016 mm thick slice of the hollow cathode plasma source. Pseudo-2D means that the slice has a small thickness and a periodic condition is applied on each plane in the transversal direction.

For the simulations many different plasma forming gasses can be used; in the previous examples argon was used. In order to limit the computation time $Si_2H_6$ was chosen as coating precursor and among its possible reactions the following two were selected:

$$Si_2H_6 + e^- \rightarrow Si_2H_4^+ + 2H + 2e^- \quad (1)$$

$$Si_2H_6 + e^- \rightarrow SiH_3 + SiH_2 + H + e^- \quad (2)$$

Hydrogen species were not included in the simulations.

For each given set of input parameters the simulation yields data regarding number and velocity of the different gas phase species (atoms, ions, molecules and electrons) throughout the space they occupy. From this data certain values can be calculated, such as densities and fluxes, where a flux is the rate of movement of gas phase species across a unit area (unit: $mol \cdot m^{-2} \cdot s^{-1}$).

Another useful calculation is the flux that is absorbed on a certain surface. Given a certain sticking coefficient of the cathode cavity material, the ion absorption on its surface can be calculated from the ion flux directed at it. By correlating results from the operation of bipolar hollow cathodes with simulation data the inventors found that the formation of debris and thus the cavity surface sputtering observed on real plasma sources was related to the level of ionized plasma species absorbed by the hollow cathodes' cavity surfaces according to the simulation model.

Argon absorption is an easily derived property from the plasma simulation that was used. Further, argon absorption is an effective gauge of the ion energy and particle flux that is incident to the electrode surface. Those skilled in the art will understand that the ion energy and particle flux are the major driving factors behind the physical process of sputtering or electrode erosion. Debris generation occurs when the balance of sputter rate versus deposition of sputtered material from nearby surfaces is biased toward a net deposition. This effect can be observed in FIGS. 16A and 16B, which indicate reduced sputtering and net deposition in the corners of the rectangular electrodes, where ion absorption was found (through simulation) to be lowest.

Accordingly, although the actual sputtering value is not measured by the simulation, the inventors have used the argon absorption values as an indicator of the sputtering or electrode erosion from the multiphase embodiment described here.

Low levels of ionized plasma species absorbed by the hollow cathodes' cavity surfaces mean that the level of cavity sputtering is low and debris formation is low. As shown in FIGS. 16A and 16B, the bipolar plasma source resulted in increased sputtering and wear of the majority of the electrode surface, where both the bipolar and multiphase plasma sources had equal plasma energy in the process chamber. The additional sputtered material from the bipolar plasma source can also result in increased debris when it is deposited on surfaces which are not undergoing intense sputtering, such as the corners of the electrode cavities and surfaces external to the plasma source (which are at floating or ground potential and not subject to sputtering). The nature and amount of this debris will be heavily dependent upon the combination of electrode surface material and plasma gas.

Another important quantity is the electron density generated. The electron density has a major influence on surface treatment or coating efficiency, with high electron densities leading to high surface treatment or coating efficiencies. In the present simulations the electron density was determined in the vacuum chamber on a line set at a distance of 2.54 mm from the chamber structure that supports the plasma source and averaged.

The inventors surprisingly found that the level of ionized plasma species absorbed by the cathode cavity surfaces was reduced when three hollow cathodes were used each with a phase shift of 120 degrees as compared to a configuration with two hollow cathodes with a phase shift of 180 degrees.

According to this embodiment of the present invention, the inventors surprisingly found that the intensity of electron density in a reaction region outside the hollow cathodes was similar for both a three-phase, three-hollow-cathode arrangement and a two-phase, two-hollow-cathode arrangement. This is surprising because, for example, the three-phase, three-hollow-cathode arrangement produces plasma concentrated on a larger area and experiences less wear inside the hollow cathodes than the two-phase, two-hollow cathode arrangement.

Many other combinations of hollow cathodes and multiphase power inputs are possible with the specific arrangements being designed to suit a particular application, as one of ordinary skill in the art will appreciate from the present disclosure.

While various embodiments have been described above, it should be understood that they have been presented by way of example only, and not limitation. Thus, the breadth and scope of the present disclosure should not limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A plasma source comprising:

at least three electrodes, including a first electrode, a second electrode, and a third electrode, the at least three electrodes being arranged linearly such that a first distance between the first electrode and the second electrode is smaller than a second distance between the first electrode and the third electrode; and a source of power capable of producing multiple output waves, including a first output wave, a second output wave, and a third output wave, wherein the first output wave and the second output wave are out of phase, the second output wave and the third output wave are out of phase, and the first output wave and the third output wave are out of phase;

wherein each electrode is electrically connected to the source of power such that the first electrode is electrically connected to the first output wave, the second electrode is electrically connected to the second output wave, and the third electrode is electrically connected to the third output wave;

wherein electrical current flows between the at least three electrodes that are out of electrical phase;

wherein each electrode alternately serves as anode and cathode when powered by the multiple output waves; and wherein the plasma source is capable of generating a plasma between the electrodes, including a first plasma directly between the first electrode and the second electrode, a second plasma directly between the second electrode and the third electrode, and a third plasma directly between the first electrode and the third electrode.

2. The plasma source of claim 1, wherein the plasma generated by the plasma source includes active electron emission for at least 80% of a period of the multiple output waves.

3. The plasma source of claim 1, wherein the plasma generated by the plasma source includes active electron emission for at least 90% of a period of the multiple output waves.

4. The plasma source of claim 1, wherein the plasma generated by the plasma source includes active electron emission for 100% of a period of the multiple output waves.

5. The plasma source of claim 1, wherein the at least three electrodes are out of electrical phase by a phase angle different from 180°.

6. The plasma source of claim 1, wherein the at least three electrodes are out of electrical phase by a phase angle of 120°.

7. The plasma source of claim 1, wherein each adjacent pair of the at least three electrodes is out of electrical phase by the same phase angle as each other adjacent pair of the at least three electrodes.

8. The plasma source of claim 1, wherein the at least three electrodes are hollow cathodes.

9. The plasma source of claim 1, wherein the at least three electrodes are each electrically insulated.

10. The plasma source of claim 1, wherein current flow is comprised of electrons derived from secondary electron emission.

11. The plasma source of claim 1, wherein the current flow is comprised of electrons derived from thermionic-emitted electrons.

12. The plasma source of claim 1, wherein the at least three electrodes are linearly arranged.

13. The plasma source of claim 1, wherein the at least three electrodes are configured to direct each plasma to a common line.

14. The plasma source of claim 1, wherein the electrical current flowing between the at least three electrodes that are out of electrical phase is a result of an electric potential difference between the at least three electrodes.

15. The plasma source of claim 14, wherein the electric potential difference is at least 50V between any two of the at least three electrodes.

16. The plasma source of claim 14, wherein the electric potential difference is at least 200V between any two of the at least three electrodes.

17. The plasma source of claim 1, wherein the multiple output waves comprise square waves whereby the electric potential difference is reduced relative to sinusoidal waves for the same overall power input.

18. The plasma source of claim 1, wherein the source of power is in the form of AC electrical energy.

19. The plasma source of claim 1, wherein the source of power is in the form of pulsed electrical energy.

20. The plasma source of claim 1, wherein the generated plasma is uniform over its length in the substantial absence of magnetic-field driven closed circuit electron drift.

21. The plasma source of claim 1, wherein the plasma is made uniform over its length from about 0.1 m to about 1 m.

22. The plasma source of claim 1, wherein the plasma is made uniform over its length from about 1 m to about 4 m.

23. The plasma source of claim 1, wherein the frequencies of each of the multiple output waves are equal and are in the range from about 1 kHz to about 500 MHz.

24. The plasma source of claim 1, wherein the frequencies of each of the multiple output waves are equal and are in the range from about 1 kHz to about 1 MHz.

25. The plasma source of claim 1, wherein the frequencies of each of the multiple output waves are equal and are in the range from about 10 kHz to about 200 kHz.

26. The plasma source of claim 1, wherein the frequencies of each of the multiple output waves are equal and are in the range from about 20 kHz to about 100 kHz.

27. The plasma source of claim 1, wherein the electrons from an emitting surface of each of the at least three electrodes are not confined by magnetic fields.

28. The plasma source of claim 1, wherein at least one of the multiple output waves produced by the source of power is configured to power a plurality of the at least three electrodes.

* * * * *